United States Patent
Barrett et al.

(10) Patent No.: US 11,086,486 B2
(45) Date of Patent: Aug. 10, 2021

(54) EXTRACTION AND RESTORATION OF OPTION SELECTIONS IN A USER INTERFACE

(71) Applicant: Klarna Bank AB, Stockholm (SE)

(72) Inventors: James W. Barrett, Stockholm (SE); Oliver Edholm, Stockholm (SE)

(73) Assignee: Klarna Bank AB, Stockholm (SE)

( * ) Notice: Subject to any disclaimer, the term of this patent is extended or adjusted under 35 U.S.C. 154(b) by 0 days.

(21) Appl. No.: 16/680,410

(22) Filed: Nov. 11, 2019

(65) Prior Publication Data

US 2021/0141499 A1    May 13, 2021

(51) Int. Cl.
| | |
|---|---|
| *G06F 3/0482* | (2013.01) |
| *G06F 3/0484* | (2013.01) |
| *G06F 3/0483* | (2013.01) |
| *G06F 30/20* | (2020.01) |
| *G06F 9/46* | (2006.01) |
| *G06N 3/10* | (2006.01) |

(52) U.S. Cl.
CPC .......... *G06F 3/0482* (2013.01); *G06F 3/0483* (2013.01); *G06F 3/04845* (2013.01); *G06F 9/461* (2013.01); *G06F 30/20* (2020.01); *G06N 3/10* (2013.01)

(58) Field of Classification Search
CPC ...... G06F 3/0482; G06F 30/20; G06F 3/0483; G06F 3/04845; G06F 9/461; G06N 3/10
See application file for complete search history.

(56) References Cited

U.S. PATENT DOCUMENTS

| | | | | |
|---|---|---|---|---|
| 6,073,163 | A * | 6/2000 | Clark | G06F 9/451 |
| | | | | 709/203 |
| 6,346,953 | B1 * | 2/2002 | Erlikh | G06F 8/38 |
| | | | | 715/709 |
| 7,788,590 | B2 | 8/2010 | Taboada et al. | |

(Continued)

FOREIGN PATENT DOCUMENTS

CN          105955889 A  *  9/2016

OTHER PUBLICATIONS

Memon et al., "GUI Ripping : Reverse Engineering of Graphical user Interfaces for Testing," IEEE, Nov. 2003, pp. 1-10. (Year: 2003).*

(Continued)

*Primary Examiner* — James T Tsai
(74) *Attorney, Agent, or Firm* — Davis Wright Tremaine LLP

(57) ABSTRACT

A first interface having a control object that is associated with a first option and a second option is launched. The control object is engaged at a first time to select the first option. A first set of differences between a first current state of the interface and a preconfigured state of the first interface is determined. The control object is engaged at a second time to select the second option. A second set of differences between a second current state of the interface and the preconfigured state of the first interface is determined. Integration code that, upon execution by a client device, causes the client device to modify a second user interface is generated based on the first set of differences or the second set of differences. The integration code is provided to the client device to cause the client device to modify the second user interface.

22 Claims, 10 Drawing Sheets

(56) References Cited

U.S. PATENT DOCUMENTS

| | | | |
|---|---|---|---|
| 8,775,923 B1* | 7/2014 | Kroeger | G06F 16/9574 715/234 |
| 8,812,546 B1* | 8/2014 | Cornali | G06Q 30/0603 707/779 |
| 9,252,962 B1 | 2/2016 | Valeti | |
| 9,753,898 B1 | 9/2017 | Glommen et al. | |
| 9,836,781 B2 | 12/2017 | Potucek et al. | |
| 9,959,027 B1 | 5/2018 | Gajulapally et al. | |
| 10,043,255 B1* | 8/2018 | Pathapati | G06F 9/451 |
| 10,121,176 B2 | 11/2018 | Buezas et al. | |
| 10,649,864 B1* | 5/2020 | Parikh | G06F 11/1474 |
| 10,748,035 B2 | 8/2020 | Lee | |
| 2002/0063734 A1 | 5/2002 | Khalfay et al. | |
| 2004/0216044 A1 | 10/2004 | Martin et al. | |
| 2006/0101392 A1 | 5/2006 | Isaza | |
| 2007/0300145 A1* | 12/2007 | Perelman | G06F 40/174 715/222 |
| 2009/0319342 A1 | 12/2009 | Shilman et al. | |
| 2010/0175050 A1 | 7/2010 | Wang et al. | |
| 2010/0191582 A1 | 7/2010 | Dicker et al. | |
| 2010/0306249 A1 | 12/2010 | Hill et al. | |
| 2011/0106732 A1 | 5/2011 | Chidlovskii | |
| 2011/0126158 A1* | 5/2011 | Fogarty | G06F 8/75 715/835 |
| 2011/0289489 A1* | 11/2011 | Kumar | G06F 11/3688 717/135 |
| 2011/0302487 A1 | 12/2011 | McCormack et al. | |
| 2012/0174069 A1 | 7/2012 | Zavatone | |
| 2014/0173415 A1 | 6/2014 | Kattil Cherian et al. | |
| 2014/0372867 A1* | 12/2014 | Tidhar | G06F 40/14 715/234 |
| 2015/0082280 A1* | 3/2015 | Betak | G06F 11/3692 717/124 |
| 2017/0038846 A1 | 2/2017 | Minnen et al. | |
| 2017/0090690 A1 | 3/2017 | Chor | |
| 2017/0124053 A1 | 5/2017 | Campbell et al. | |
| 2017/0337116 A1 | 11/2017 | Negara et al. | |
| 2017/0372408 A1 | 12/2017 | Khandelwal et al. | |
| 2018/0024915 A1* | 1/2018 | Taneja | G06F 11/3688 714/38.1 |
| 2018/0335939 A1 | 11/2018 | Karunamuni et al. | |
| 2018/0336574 A1 | 11/2018 | Mohan et al. | |
| 2018/0350144 A1 | 12/2018 | Rathod | |
| 2019/0007508 A1 | 1/2019 | Xu et al. | |
| 2019/0114059 A1 | 4/2019 | Chakra et al. | |
| 2019/0114061 A1 | 4/2019 | Daniels et al. | |
| 2019/0158994 A1 | 5/2019 | Gross et al. | |
| 2019/0205773 A1 | 7/2019 | Ackerman et al. | |
| 2019/0259293 A1 | 8/2019 | Hellman et al. | |
| 2019/0294642 A1 | 9/2019 | Matlick et al. | |
| 2019/0384699 A1 | 12/2019 | Arbon et al. | |
| 2020/0007487 A1 | 1/2020 | Chao et al. | |
| 2020/0089813 A1 | 3/2020 | Chauhan | |
| 2020/0125635 A1 | 4/2020 | Nuolf et al. | |
| 2020/0134388 A1 | 4/2020 | Rohde | |
| 2020/0201689 A1* | 6/2020 | Laethem | G06F 9/543 |
| 2020/0394396 A1 | 12/2020 | Yanamandra et al. | |
| 2020/0409668 A1 | 12/2020 | Eberlein et al. | |

OTHER PUBLICATIONS

International Search Report and Written Opinion dated Feb. 16, 2021, Patent Application No. PCT/IB2020/060585, 16 pages.

Wikipedia, "k-means clustering," Wikipedia the Free Encyclopedia, last edited Jun. 25, 2020 (retrieved Jul. 9, 2020), https://en.wikipedia.org/wiki/k-means_clustering, 16 pages.

Hou et al., "Malicious web content detection by machine learning," Expert Systems With Applications 37(1):55-60, Jan. 1, 2010.

International Search Report and Written Opinion dated Apr. 6, 2021, Patent Application No. PCT/IB2021/050169, 15 pages.

* cited by examiner

EXTRACTION AND RESTORATION OF OPTION SELECTIONS IN A USER INTERFACE

CROSS-REFERENCE TO RELATED APPLICATIONS

This application incorporates by reference for all purposes the full disclosure of co-pending U.S. patent application Ser. No. 16/680,392, filed concurrently herewith, entitled "DYNAMIC LOCATION AND EXTRACTION OF A USER INTERFACE ELEMENT STATE IN A USER INTERFACE THAT IS DEPENDENT ON AN EVENT OCCURRENCE IN A DIFFERENT USER INTERFACE", U.S. patent application Ser. No. 16/680,396, filed concurrently herewith, entitled "UNSUPERVISED LOCATION AND EXTRACTION OF OPTION ELEMENTS IN A USER INTERFACE", U.S. patent application Ser. No. 16/680,403, filed concurrently herewith, entitled "DYNAMIC IDENTIFICATION OF USER INTERFACE ELEMENTS THROUGH UNSUPERVISED EXPLORATION", U.S. patent application Ser. No. 16/680,406, filed concurrently herewith, entitled "LOCATION AND EXTRACTION OF ITEM ELEMENTS IN A USER INTERFACE", and U.S. patent application Ser. No. 16/680,408, filed concurrently herewith, entitled "UNSUPERVISED LOCATION AND EXTRACTION OF QUANTITY AND UNIT VALUE ELEMENTS IN A USER INTERFACE".

BACKGROUND

In many contexts, users may interact with various interfaces of service providers. Users often desire to perform various processes that may involve the selection of various options with regards to the services of the service providers. At times a user might begin a process with a service, select various options as part of the process with the service, but desires to complete the process at a later date. In such a case, the user often has to restart the process from the beginning. Still further, the user may desire to but be unable to share interfaces with configured options with other users. Providing users with the ability to streamline such processes presents a challenge, especially as the various service providers often have their own particular implementations of their interfaces involving large amounts of sub-processes and other complexities.

BRIEF DESCRIPTION OF THE DRAWINGS

Various techniques will be described with reference to the drawings, in which.

DETAILED DESCRIPTION

Figure 1:
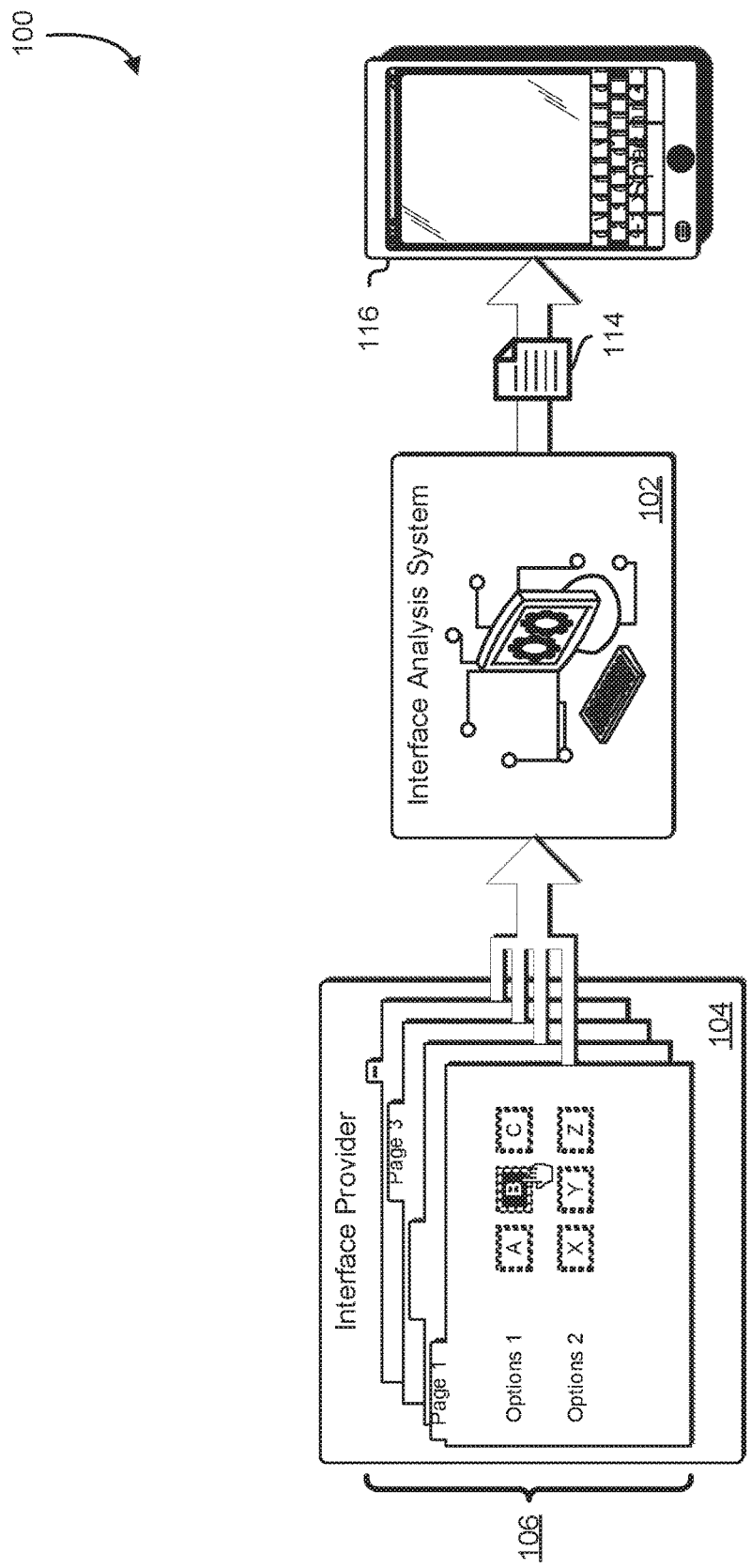
FIG. 1 illustrates an example of an interface analysis system generating integration code based on an analysis of webpages of an interface provider in accordance with an embodiment.

Techniques and systems described herein relate to providing users of various services, which may interact with the users through various interfaces, with integration code that can model and/or streamline various processes and functionalities of the various interfaces. The integration code can be utilized such that a user may begin a process with a service, and resume the process at a later time without losing any information that user may have already input as part of the process. An integration code may provide various technological advantages, such as the ability for a user device to streamline interactions with service providers without having to burden the user with inputting information that the user may have already provided to the service providers as part of the interactions.

To illustrate, as an example, a user may provide a system with an interface. In this example, the user may select various options through the interface. Continuing with this example, the system may extract and save or otherwise store the selected various options of the interface, and generate integration code. Continuing with the example, the user may, at a later time, cause the system to utilize the integration code to restore the selected options of the interface and provide the interface comprising the restored selected options to the user.

As an illustrative example of one use case of the techniques described in the present disclosure, the above-mentioned interface may be an interface of an interface provider, which may provide various services. The interface provider may be a library organization of many library organizations that utilize one or more interfaces that users may interact with to select and borrow books. A system of the present disclosure may analyze the interfaces of the library organization in order generate integration code capable of, when executed, dynamically interacting with the interfaces for the benefit of the user. In doing so, the system may analyze the interfaces to classify various elements of the interfaces using one or more classification and machine learning algorithms, such as a recurrent neural network (RNN), convolutional neural network (CNN), a random forest classifier, keyword searches, regular expressions, digital image recognition algorithms, and/or variations or combinations thereof, to determine the identity and functionality of the various elements such that the integration code may incorporate and utilize the various elements.

In this illustrative example, the integration code may be code that models or executes various processes using the interfaces of the library organization. In this illustrative example, the integration code may comprise multiple codes for restoring a configuration of an interface of the library organization. For example, a user may, through an interface of the library organization, select a desired book to be borrowed. The user may indicate the desired book through a specific configuration of one or more interface elements of the interface. The user may then desire to wait until a later date to borrow the desired book. The system may then generate integration code based upon the specified configuration that may, upon the appropriate use of the integration code by the user (e.g., via a mobile device such as a smartphone), restore the specified configuration of the one or more interface elements of the interface on behalf of the user.

As an alternative illustrative example, an interface provider may be a service provider such as a utility provider. The utility provider may utilize one or more interfaces that users may interact with to perform various processes regarding utilities the users may utilize. A user may desire to change an address registered with the utility provider at a later date. The user may utilize an interface of the utility provider to input the desired new address. The user may cause a system to analyze the interface, as well as the input desired new address, of the utility provider and generate integration code. In some examples the system may have already analyzed the utility provider and generated integration code. The integration code may be code that models or executes various processes using the interfaces of the utility provider. The integration code may comprise multiple codes for different processes, such as restoring a previously entered address, updating utility options, activating/de-activating specific services, and the like. The user may use the integration code at the later date to restore the interface of the utility provider that comprises the previously input desired new address.

To illustrate, in another example, a preconfigured state of a first interface having a preconfigured interface element is obtained, with the first interface being provided by an entity. In the example, the first interface is launched in an unpreconfigured state, with the first interface including a first configurable interface element corresponding to the preconfigured interface element, and the first configurable interface element being associated with a first option and a second option. Still in the example, a first configured interface is produced by simulating human interaction with the first configurable interface element to cause the first option of the first configurable interface element to be selected.

Continuing with the example, a first set of differences between a current state of the first configured interface and the first preconfigured state is determined. Still further in the example, a second configured interface is produced by simulating the human interaction with the first configurable interface element to cause the second option of the first configurable interface element to be selected. Additionally, in the example, a second set of differences between a current state of the second configured interface and the first preconfigured state is determined.

Further continuing with the example, it is determined which of the first set of differences or the second set of differences indicates a closest match to the preconfigured state. Then, in the example, integration code is generated based on the closest match. Still in the example, the integration code is stored in association with the entity.

Additionally, in the example, the application is provided, to the client device, in response to a first request from a client device for an application. Also in the example, a request is obtained, from a client device, for the integration code associated with the entity as a result of execution of the application. Finally, in the example, the client device is caused, by providing the integration code to the client device, to modify a second interface to cause a second configurable element in the second interface to be selected, the second interface associated with the entity.

Note that the illustrative examples above are for illustrative purposes only, and the techniques described in the present disclosure are contemplated to be applicable to a variety of other interface and/or service providers that have interfaces accessible via a client device. In the preceding and following description, various techniques are described. For purposes of explanation, specific configurations and details are set forth in order to provide a thorough understanding of possible ways of implementing the techniques. However, it will also be apparent that the techniques described below may be practiced in different configurations without the specific details. Furthermore, well-known features may be omitted or simplified to avoid obscuring the techniques being described.

Techniques described and suggested in the present disclosure improve the field of computing, especially the field of computer interface interaction, by creating integration code that, when executed, allows a device to automatically configure elements of a user interface in accordance with a user's preferences without requiring input from the user. Additionally, techniques described and suggested in the present disclosure improve the usability of computer systems by allowing users to store configured interfaces and restore the configured interfaces at later times, even when the interface itself lacks the ability to do so. Moreover, techniques described and suggested in the present disclosure are necessarily rooted in computer technology in order to overcome problems specifically arising with being able to determine the functionality, values, and attributes of various elements of an interface by dynamically interacting with the elements and observing the results of the interaction.

FIG. 1 illustrates an example 100 of an interface analysis system generating integration code based on an analysis of interfaces of an interface provider, in accordance with an embodiment. As illustrated in FIG. 1, the example 100 may include an interface provider 104 which may provide a plurality of interfaces 106, which may be analyzed by an interface analysis system 102, which may generate integration code 114 for a client device 116.

In an embodiment, the interface analysis system 102 may be any entity operable to access various systems and/or services. The interface analysis system 102 may be implemented as software, hardware, and/or variations thereof. The interface analysis system 102 may interact with various interfaces to identify the various interfaces as well as elements within the various interfaces. In some examples, the interface analysis system 102 may be implemented as an application or service executing on a computing device, such as the computing device 1000 of FIG. 10. Examples of such a computing device include one or more instances of a physical computing instance (e.g., a physical server computer, a mobile communication device, a laptop computer, a tablet computer, a personal computer, a mainframe, etc.) or one or more instances of a virtual computing instance, such as a virtual machine hosted on one or more computer servers, or other computing system capable of communicating with various systems and/or services. The interface analysis system 102 may interact with various interfaces, such as Internet webpages (e.g., markup language interfaces), computing applications, computing services, mobile devices, and/or variations thereof.

The interface provider 104 may be an entity that may provide interfaces for various services which the interface provider 104 may provide. Examples of such services the interface provider 104 may provide include data processing, data storage, applications, security, encryption, library services, utility services, television services, entertainment services and/or other such services. The interface provider 104 may provide the plurality of interfaces 106, in which various entities may interact with to access the services of the interface provider 104. The plurality of interfaces 106 may be one or more interfaces of the services accessible through the Internet, and in some examples, the plurality of interfaces 106 may be identified with one or more uniform resource identifiers (URIs). It should be noted that, in various embodiments, the plurality of interfaces 106 may be implemented as any interface, such as a graphical user interface or other type of interface provided to a user for interaction with interface elements, and/or variations thereof.

In various examples, the interface analysis system 102 may interact with the plurality of interfaces 106 through the use of simulated human interaction. In various embodiments, the simulated human interaction may vary in implementation depending on which interface the interface analysis system 102 is interacting with. For example, the interface analysis system 102 may be interacting with an Internet webpage through an Internet web interface, in which the simulated human interaction may be implemented by simulating (e.g., via execution of event handlers, such as onClick, onMouseOver, onMouseOut, onKeyDown, etc.) a pointer object (e.g., mouse cursor). As an alternative example, the interface analysis system 102 may interact via a command-line interface, in which the simulated human interaction may be implemented according to various text commands. In some examples, the simulated human interaction may be any element/entity that enables the interface analysis system 102 to interact with a desired interface such as the plurality of interfaces 106.

The interface analysis system 102 may analyze the plurality of interfaces 106 in order to classify and/or identify the functionalities of various elements of the plurality of interfaces 106. For example, the interface analysis system 102 may analyze various elements of the plurality of interfaces 106 (e.g., such as the source code of the plurality of interfaces 106, a document object model (DOM) of the plurality of interfaces 106, and/or intercepted communications between a user device and the plurality of interfaces 106) to determine information about the plurality of interfaces 106. The interface analysis system 102 may analyze the structure of the plurality of interfaces 106 (e.g., a DOM of the interfaces) to identify a set of interface elements. The interface analysis system 102 may pass the set of interface elements as input to one or more machine learning classifiers in order to classify the set of interface elements. Based on the classifications, the interface analysis system 102 may further determine the functionalities of the interface elements. In some examples, the interface elements may comprise various configurable and/or selectable elements. For example, the plurality of interfaces 106, as depicted in FIG. 1, may include an interface element depicted as "Options 1" that may correspond to selectable option elements depicted as "A," "B," and "C." Continuing with the example, the plurality of interfaces 106, as depicted in FIG. 1, may include an interface element depicted as "Options 2" that may correspond to selectable option elements depicted as "X," "Y," and "Z." In various examples in the present disclosure, an interface element or element may refer to an individual component of an interface having one or more attributes. Likewise, in the present disclosure, an interface element may alternatively be referred to as an "object" of a DOM of the interface. Additionally, in various examples in the present disclosure, an interface element that may correspond to selectable options elements (e.g., interface element depicted as "Options 2" that may correspond to selectable option elements depicted as "X," "Y," and "Z") may be referred to as a control object associated with one or more options or a configurable control object.

The interface analysis system 102 may determine various processes to select various selectable elements of the plurality of interfaces 106. The interface analysis system 102 may generate the integration code 114 that may be executable code to perform such processes, and may provide the integration code 114 to the client device 116 through one or more communication networks such that the client device 116 may utilize the integration code 114 to perform the processes. The integration code 114 may additionally specify a configuration of selectable elements to be selected. In some examples, the integration code 114 may be executable code configured to interact with the interface provider 104 through one or more interfaces, such as the plurality of interfaces 106. In some examples, the integration code 114 may include code to execute a specific process. For example, the integration code 114 may include code that causes the selection of one or more elements of an interface of the interface provider 104 to accomplish a specified task. In some examples, the integration code 114 may include code that identifies elements and interfaces of the interface provider 104 such that an entity may utilize the elements and interfaces of the interface provider 104 appropriately.

It should be noted that, in various embodiments, the integration code 114 may be executed by a client device, a remote server, and/or variations thereof, to perform any process in connection with the interface provider 104. In some embodiments, the integration code is in a programming language that can be executed by a device with one or more processors. In alternate embodiments, the integration code 114 may not be strictly executable itself, but may be structured data (e.g., a configuration file, key/value pairs, etc.) that may be processed by a software application running on such a device (e.g., the client device 116) to enable the software application to interact via the device with the interface elements of the interfaces provided by the interface provider 104. In places within the present disclosure referring to execution of integration code, this alternate embodiment is also contemplated.

Additionally, it should be noted that the operations of FIG. 1 may be utilized in any order, including parallel. For example, the integration code 114 may be generated in real-time as an entity interacts with the interface provider 104 via the client device 116. Continuing with this example, the integration code 114 may be transmitted to the entity as the entity is interacting with the interface provider 104; the entity may then utilize the integration code 114 to streamline interactions with the interface provider 104. In some alternative examples, the interface analysis system 102 may preemptively analyze and determine integration code for a variety of computing services/providers, and provide the integration codes for users desiring certain functionalities from the computing services/providers.

Figure 2:
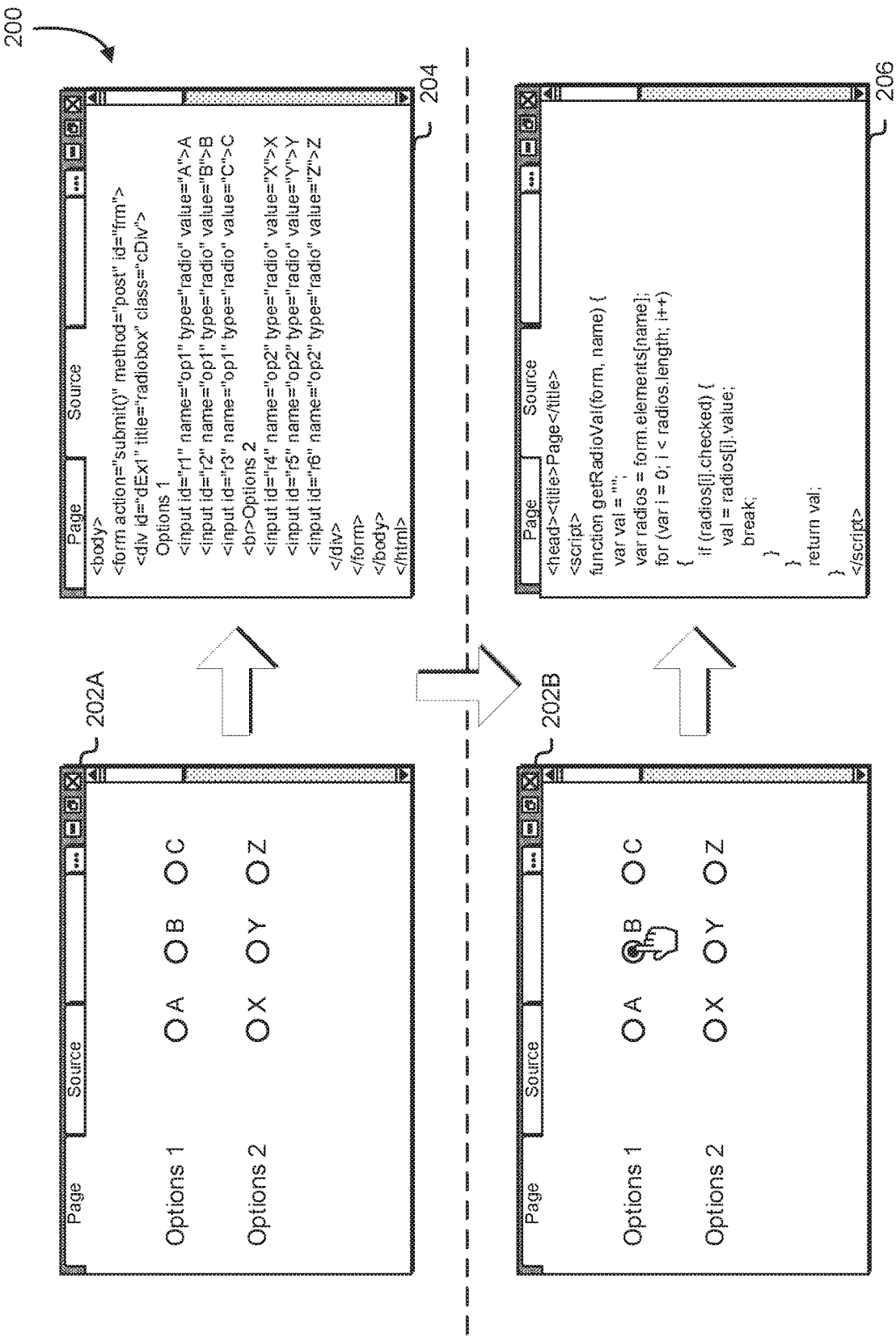
FIG. 2 illustrates an example of analyzing an interface with radio buttons to determine selected options in accordance with an embodiment.

FIG. 2 illustrates an example 200 of analyzing an interface with radio buttons to determine selected options, in accordance with an embodiment. As illustrated in FIG. 2, the example 200 includes an interface at a first time 202A associated with a source code 204, an interface at a second time 202B, and function code 206. In various embodiments, the interfaces may be interfaces of an interface provider that may provide various services, in which entities may interact with to access various services. The interfaces may include radio buttons, which may be a group of graphical elements of an interface that enables an entity to select only one of a predefined set of mutually exclusive options. Referring to FIG. 2, an element depicted as "Options 1" may have a set of radio buttons "A," "B," and "C," in which only one of radio buttons "A," "B," and "C" may be selected for the element "Options 1." Furthermore, referring to FIG. 2, an element depicted as "Options 2" may have a set of radio buttons "X," "Y," and "Z," in which only one of radio buttons "X," "Y," and "Z" may be selected for the element "Options 2." Note that, the present disclosure refers to radio buttons for illustrative purposes only and it is contemplated that techniques of the present disclosure may be applied to other types of option selection controls, including but not limited to checkboxes, drop-down lists, text/number fields, hidden fields, date/time controls, telephone number fields, Uniform Resource Locator fields, color pickers, email address fields, range controls, file upload controls, search fields, and other such control objects for selecting options and/or other customizations. For example, a text field may be used to input special instructions (e.g., "Braille version preferred") or a number field may be used for inputting a library card number. It is further contemplated that such option selection controls need not be limited to Hypertext Markup Language Controls, but may include option selection controls in other types of interfaces having similar characteristics.

The interface at a first time 202A may be provided to a system, such as the interface analysis system 102 as described in connection with FIG. 1. The system may perform one or more processes to obtain the interface at a first time 202A. In some examples, the system may be provided with the interface at a first time 202A. In some examples, the system may utilize an input from one or more entities to obtain the interface at a first time 202A. The system may additionally obtain the source code 204. In various examples, the source code 204 may be code implemented as cascading style sheets (CSS) code, Hypertext Markup Language (HTML) or other markup language code, JavaScript code, and/or any code that may be associated with the interface at a first time 202A. The source code 204 may provide a representation of the interface at a first time 202A. The system may inject the function code 206 into the source code 204. In some examples, the system may modify the source code 204 to include the function code 206. In various embodiments, the function code 206 may be an executable function that indicates to the system various characteristics of a given interface, such as the selection state of the options in the first interface at the second time 202B. The interface at the first time 202A may be in an un-configured state whereby none of the options are selected, or default options are selected.

The system may be provided with various code to obtain the interface at a second time 202B. In some examples, the system may be provided with code that identifies the elements of the interface at a first time 202A, and selects one or more elements of the interface at a first time 202A to obtain the interface at a second time 202B. In various examples, the system may be provided with code that identifies the elements of the interface at a first time 202A, and utilize the code to obtain the interface at a second time 202B. In other examples, the system may be provided with injectable code that the system may inject into the source code 204 to obtain the interface at a second time 202B. Furthermore, in some examples, the system may utilize simulated human interaction to interact with the interface at a first time 202A to obtain the interface at a second time 202B. The system may utilize simulated human interaction to interact with and/or select various elements of the interface at a first time 202A. In some examples, the simulated human interaction may be implemented as triggering a click or touch event (e.g., onClick, onMouseDown, onMouseUp, etc.). In some embodiments, the system may simulate human interaction by simulating an input device (e.g., mouse, trackball, keyboard, etc.) to manipulate a pointer object to overlay an interface element and then simulate one or more "clicks" or other event to engage and/or select the interface element.

The interface at a second time 202B may be the result of interaction with the interface at a first time 202A. The interaction may comprise various processes that may select various interface elements of the interface at a first time 202A. For example, the interaction may comprise the selection of the element "B" for the element "Options 1." The system may desire to determine which specific processes performed in connection with the interface at a first time 202A resulted in the interface at a second time 202B. The system may desire to determine specifically which elements of the interface at a first time 202A were selected to result in the interface at a second time 202B. For example, the system may desire to determine which of the elements "A," "B," or "C" were selected for the element "Options 1" within the interface at a first time 202A to result in the interface at a second time 202B.

The system may utilize the function code 206 to determine the various processes that, when performed on the interface at a first time 202A, resulted in the interface at a second time 202B. In various examples, the function code 206 may be part of the source code 204. In some examples, the function code 206 may be JavaScript code that is injected into the source code 204. The function code 206 may be code provided by the system or retrieved from one or more other systems. The function code 206 may be executable code that may indicate which elements of the interface at a first time 202A were selected in the interface at the second time 202B. For example, the function code 206 may indicate to the system that the element "B" was selected for the element "Options 1" within the interface at a first time 202A to result in the interface at a second time 202B. The system may generate integration code based on the determination. In some examples, the integration code may be executable code that, when applied to the interface at a first time 202A, results in the interface at a second time 202B.

Figure 3:
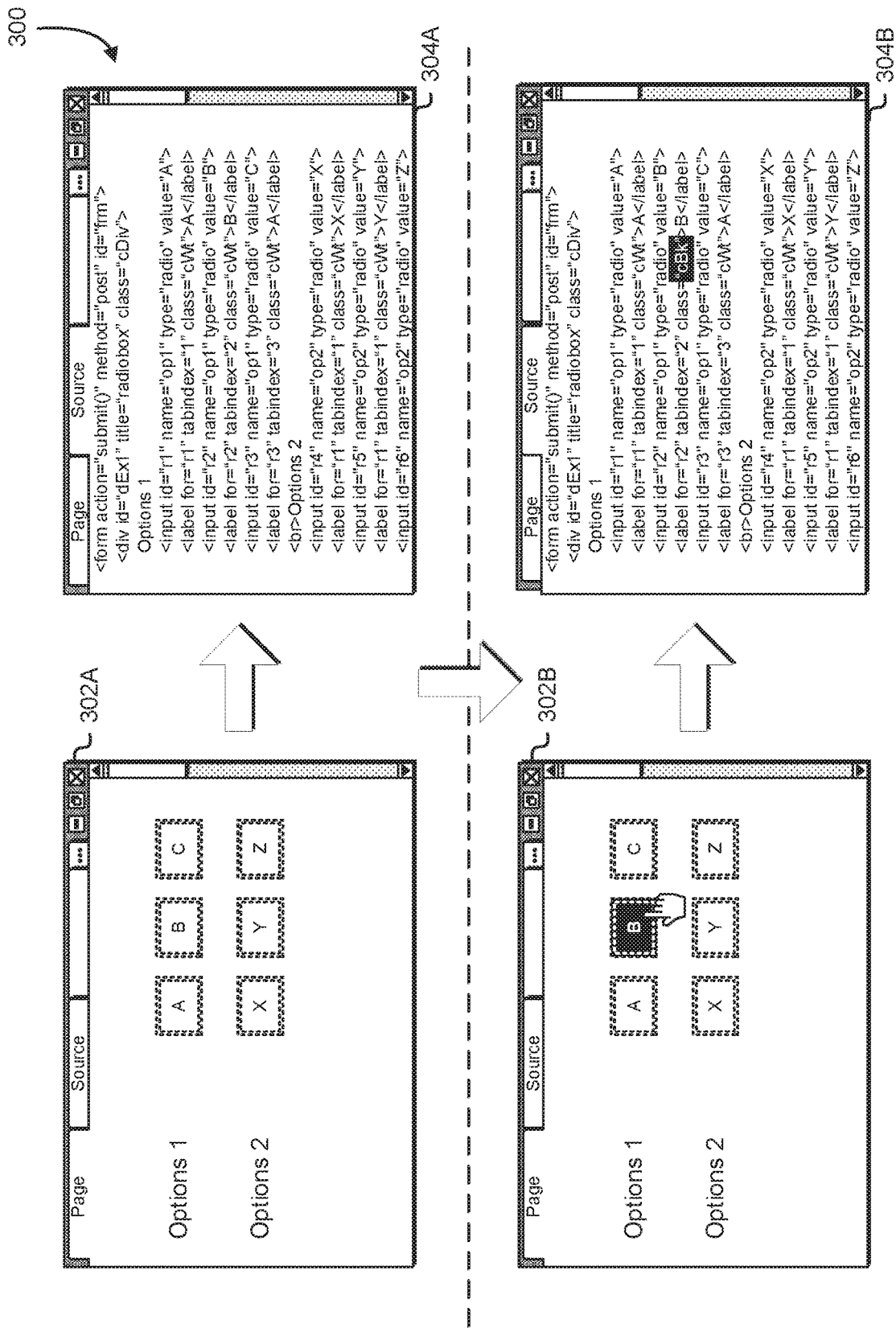
FIG. 3 illustrates an example of analyzing an interface with non-standard option control elements to determine selected options in accordance with an embodiment.

FIG. 3 illustrates an example 300 of analyzing an interface with non-standard option control elements to determine selected options, in accordance with an embodiment. As illustrated in FIG. 3, the example 300 includes an interface at a first time 302A associated with a source code at a first time 304A, and an interface at a second time 302B associated with a source code at a second time 304B. In various embodiments, the interfaces may be interfaces of an interface provider that may provide various services, in which entities may interact with to access the various services. The interfaces may include option control elements, which may be graphical elements, or interface elements, of an interface that enable an entity to select elements of a predefined set of options. Referring to FIG. 3, an element depicted as "Options 1" may have a set of selectable option control elements "A," "B," and "C," in which "A," "B," and/or "C" may be selected for the element "Options 1." Furthermore, referring to FIG. 3, an element depicted as "Options 2" may have a set of selectable option control elements "X," "Y," and "Z," in which "X," "Y," and/or "Z" may be selected for the element "Options 2."

The interface at a first time 302A may be provided to a system, such as the interface analysis system 102 as described in connection with FIG. 1. The system may perform one or more processes to obtain the interface at a first time 302A. In some examples, the system may be provided with the uniform resource identifier (URI) of the interface at a first time 302A. In some examples, the system may utilize an input from one or more entities to obtain the interface at a first time 302A. The interface at the first time 302A may be in an un-configured state whereby none of the options are selected, or default options are selected. The system may additionally obtain the source code at a first time 304A. In various examples, the source code at a first time 304A may be code implemented as CSS code, markup language code, JavaScript code, and/or any code that may be associated with the interface at a first time 302A. The source code at a first time 304A may provide a representation of the interface at a first time 302A.

The system may be provided with various code to obtain the interface at a second time 302B and the source code at a second time 304B. In some examples, the system may be provided with code that identifies the elements of the interface at a first time 302A, selects one or more elements of the interface at a first time 302A to obtain the interface at a second time 302B, and refreshes or otherwise updates the source code at a first time 304A to obtain the source code at a second time 304B. In various examples, the system may be provided with code that identifies the elements of the interface at a first time 302A, and utilize the code to obtain the interface at a second time 302B and the source code at a second time 304B. In other examples, the system may be provided with executable code that the system may utilize in connection with the interface at a first time 304A to obtain the interface at a second time 302B and the source code at a second time 304B.

The interface at a second time 302B may be the result of various interactions with the interface at a first time 302A. The interactions may comprise various processes that may select various elements of the interface at a first time 302A. The system may desire to determine which specific processes performed in connection with the interface at a first time 302A may result in the interface at a second time 302B. The system may save a representation of the source code at a second time 304B. In some examples, the system may directly save the source code at a second time 304B. In either case, the selection state of the options of the first interface at the second time 302B may be stored within the saved data. The system may utilize one or more data stores, such as a database, which may be hosted by one or more systems to save a representation of the source code at a second time 304B and/or the source code at a second time 304B itself.

The system may utilize simulated human interaction to interact with/select various elements of the interface at a first time 302A. In some examples, the simulated human interaction may be implemented as triggering a click or touch event (e.g., onClick, onMouseDown, onMouseUp, etc.). In some embodiments, the system may simulate human interaction by simulating an input device (e.g., mouse, trackball, keyboard, etc.) to manipulate a pointer object to overlay an interface element and then simulate one or more "clicks" or other event to engage and/or select the interface element.

The system may determine various processes that, when performed on the interface at a first time 302A, result in the interface at a second time 302B. In various examples, the system may continuously select elements of the interface at a first time 302A, refresh the source code at a first time 304A to reflect any changes that may have occurred as a result of the selection of the elements, and compare the refreshed source code at a first time 304A with the saved source code at a second time 304B until the difference between the refreshed source code at a first time 304A and the saved source code at a second time 304B is minimized. The system may generate sets of refreshed source code at a first time 304A based on various configurations of various processes (e.g., different configurations of element selections of the interface at a first time 302A via simulated human interaction, such as selecting element "A" for "Option 1," or selecting element "B" for "Option 1," and so on), and compare the sets of refreshed source code at a first time 304A with the saved source code at a second time 304B to determine which refreshed source code at a first time 304A is the closest to the saved source code at a second time 304B.

The system may then determine which processes, which may have been performed on the interface at a first time 302A, resulted in the interface at a second time 302B. The system may generate integration code based on the determination. In some examples, the integration code may be executable code that, when applied to the interface at a first time 302A and the source code at a first time 304A, results in the interface at a second time 302B and the source code at a second time 304B. As an illustrative example, referring to FIG. 3, the system may determine through the above described processes that the element "B" was selected for the element "Option 1" within the interface at a first time 302A to result in the interface at a second time 302B. Continuing with this example, the system may generate integration code that, when applied to the interface at a first time 302A and the source code at a first time 304A through one or more processes (e.g., executing the integration code, or otherwise utilizing the integration code in connection with the interface at a first time 302A and the source code at a first time 304A), results in the interface at a second time 302B and the source code at a second time 304B.

Figure 4:
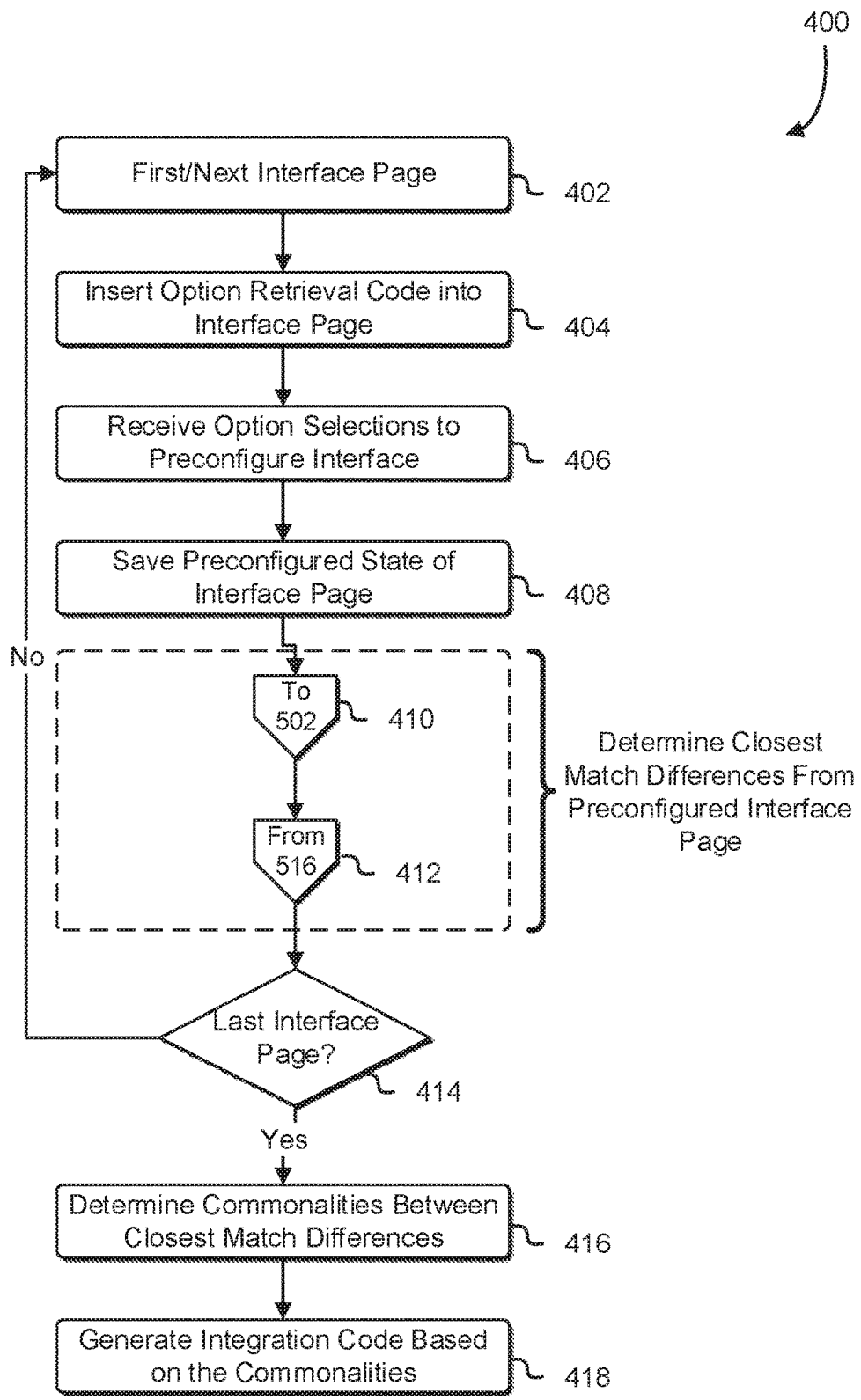
FIG. 4 is a flowchart that illustrates an example of generating integration code based on commonalities between different interfaces of an entity in accordance with an embodiment.

FIG. 4 is flowchart that illustrates an example of a process 400 for generating integration code based on commonalities between different interfaces of an entity, in accordance with an embodiment. Some or all of the process 400 (or any other processes described, or variations and/or combinations of those processes) may be performed under the control of one or more computer systems configured with executable instructions and/or other data, and may be implemented as executable instructions executing collectively on one or more processors. The executable instructions and/or other data may be stored on a non-transitory computer-readable storage medium (e.g., a computer software program persistently stored on magnetic, optical, or flash, or other persistent storage media). For example, some or all of process 400 may be performed by any suitable system, such as the computing device 1000 of FIG. 10, or a system such as the interface analysis system 102 as described in connection with FIG. 1. The process 400 includes a series of operations wherein integration code is generated based upon commonalities between different interfaces of an entity.

The system performing the process 400 may obtain a set of interfaces. In various embodiments, the set of interfaces may be interfaces of an entity such as an interface provider that may provide various services, in which entities may interact with to access the various services. In some examples, the set of interfaces may comprise different interfaces that correspond to different services of the interface provider. The system may, in 402, process each interface of the set of interfaces. In various examples, the interface being processed may be denoted as the given interface.

In 404, the system may modify the source code of the given interface by inserting option retrieval code into the given interface. In some examples, the option retrieval code may be executable code that identifies any interface option objects of the given interface, which may be denoted as option control elements. In various embodiments, an interface option object may be an interface element that provides various elements that may be selected as options for the interface element. The option retrieval code may analyze the given interface, and classify the functionalities of various elements of the given interface. The option retrieval code may retrieve and classify any selectable elements of the given interface. In some examples, the option retrieval code may utilize classification algorithms and/or various neural networks to classify and retrieve any potential selectable option elements of the given interface. The option retrieval code may indicate to the system any options that may selected through one or more elements of the given interface. For example, the given interface may comprise an interface option object reading "Options 1" corresponding to selectable elements/options "A," "B," and "C," in which the option retrieval code may indicate to the system the identity/function of the interface option object and corresponding selectable elements/options.

In 406, the system may receive (e.g., via user input or an automated software agent) option selections to preconfigure the given interface. For example, an automated software agent may comprise the option retrieval code that specifies the option selections or obtains the option selections through one or more processes (e.g., obtains the option selections from data storage). In some examples, the option selections may indicate a specific configuration of elements of the given interface to be selected through one or more processes within the given interface. For example, the given interface may comprise an interface option object reading "Options 1" corresponding to selectable elements/options "A," "B," and "C," in which the specific configuration may indicate the selection of the selectable element "A." In some examples, the system may obtain code or perform a function that, through one or more processes, selects the specific configuration of elements of the given interface as indicated by the option selections to preconfigure the given interface. In various embodiments, the system may preconfigure the given interface by configuring one or more interface option objects according to the option selections. Each of the set of interfaces may be associated with their own different options and different option selections to preconfigure additional states for the respective interfaces.

In 408, the system may save the preconfigured state of the given interface. In some examples, the system may save a representation of the preconfigured state; in various embodiments, the representation may be markup language code, CSS code, JavaScript code, JavaScript Object Notation (JSON), or any appropriate representation of the preconfigured state.

In 410-412, the system may select various elements of the given interface. The system may select various elements of the given interface, and compare the resulting interface with the saved preconfigured interface. The system may continuously select various elements of the given interface until a difference between a resulting interface and the saved preconfigured interface is minimized. Further information regarding the processes of 410-412 may be found in the description of FIG. 5. The system may determine which resulting interface most closely matches the preconfigured interface; the determined interface may be denoted as the closest match to the preconfigured interface. Note that n various embodiments, a match does not necessarily require equality. For example, two values may match if they are not equal but are mathematically equivalent. As another example, two values may match if they correspond to a common object (e.g., value) or are in some predetermined way complementary and/or they satisfy one or more matching criteria. Generally, any way of determining whether there is a match may be used. In the case of an element potentially matching a known element, the integration code generator may determine a classification and functionality for the element.

In 414, the system may determine if the given interface being analyzed is the last interface of the set of interfaces. The system may repeat 402-414 for all of the interfaces of the set of interfaces. The system may determine closest matches for each interface of the set of interfaces. The system may then further determine a set of closest match differences. In various embodiments, the set of closest match differences comprises the differences between each closest match and its corresponding preconfigured interface of the set of interfaces.

In 416, the system may determine commonalities between the closest match differences. The system may determine commonalities between the closest match differences of the set of closest match differences. The system may determine that various elements are present in each of the closest match differences. That is, some differences in each of the closest match differences may be specific to the respective interface page and may be related to other factors (e.g., the particular interface page, the user session, etc.), so by comparing the differences in each of the closest match differences, the system may determine the differences that are common to each of or a majority of the closest match differences to determine the fewest differences that are the result of the option selections.

The system may further determine the functionality of the various elements by comparing the usage of the various elements within the closest match differences.

In 418, the system may generate integration code based on the commonalities. In various embodiments, the integration code may be executable code that, when applied to a particular interface, results in a corresponding preconfigured interface, which may be configured according to a specified option selection for the particular interface. In various alternative embodiments, the integration code that may be code that models or otherwise represents an interface such that an entity may utilize the integration code to perform one or more processes on the interface to obtain a corresponding preconfigured interface. In various embodiments, the integration code may be generated such that it may be applied to each interface of the set of interfaces. The integration code may be universally applied to each interface of the set of interfaces such that, through the usage of the integration code, a particular interface may be configured to a specific configuration. Note that one or more of the operations performed in 402-18 may be performed in various orders and combinations, including in parallel.

Figure 5:
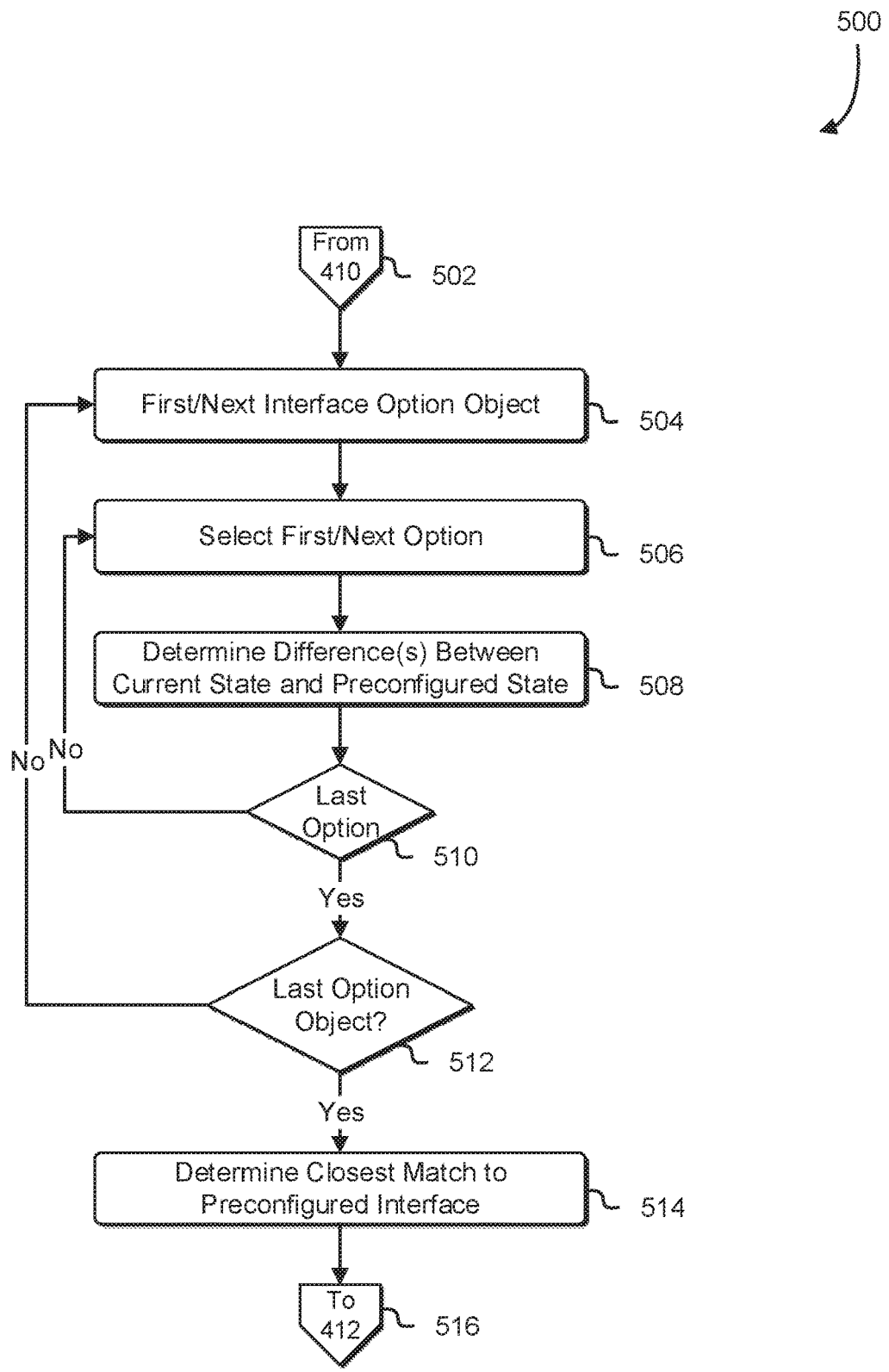
FIG. 5 is a flowchart that illustrates an example of determining closest match differences from a preconfigured interface in accordance with an embodiment.

FIG. 5 is a flowchart that illustrates an example of a process 500 of determining closest match differences from a preconfigured interface in accordance with an embodiment. Some or all of the process 500 (or any other processes described, or variations and/or combinations of those processes) may be performed under the control of one or more computer systems configured with executable instructions and/or other data, and may be implemented as executable instructions executing collectively on one or more processors. The executable instructions and/or other data may be stored on a non-transitory computer-readable storage medium (e.g., a computer software program persistently stored on magnetic, optical, or other persistent storage media). For example, some or all of process 500 may be performed by any suitable system, such as the computing device 1000 of FIG. 10 or the interface analysis system 102 as described in connection with FIG. 1. The process 500 includes a series of operations that may be performed in 410-412 of the process 400 as depicted in FIG. 4.

In 502, the system performing the process 500 may obtain, from 410, a given interface. The system may analyze the given interface to determine a set of interface option objects. In various embodiments, the system may analyze the given interface through the use of one or more classification algorithms, which may include the use of various machine learning processes such as CNN, RNN, random forest classifier, and/or variations thereof. In 504, the system may determine the set of interface option objects, and may analyze each interface option object of the set of interface option objects. In various embodiments, an interface option object may be an interface element that provides various elements that may be selected as options for the interface element. In various embodiments, an interface option object may comprise a set of selectable elements, which may be denoted as options. For example, an interface option object may be depicted as an element reading "Options 1" with selectable elements/options depicted as elements "A," "B," and "C."

In 506, the system may select an option of the options corresponding to the interface option object. The system may, in 508, determine differences between the current state and preconfigured state. The system may refresh or otherwise update the given interface to obtain the current state. The current state of the given interface may reflect the selection of the option of the options corresponding to the interface option object. In some examples, the system may compare a representation of the current state with a stored representation of the preconfigured state. Further information regarding the preconfigured state of the given interface can be found in the description of FIG. 4.

In 510, the system may determine if the option selected is the last option of the options corresponding to the interface option object. The system may repeat 506-510 for each option of the options corresponding to the interface option object. In 512, the system may determine if the interface option object is the last option object of the set of interface option objects. The system may repeat 504-512 for each interface option object of the set of interface option objects. The system may compare the differences determined for each option of each interface option object. The system may determine, in 514, the closest match to the preconfigured interface. In various embodiments, the system may determine which options selected for which interface option object results in an interface that most closely matches the preconfigured interface. The system may compare various interfaces, which may result from various configurations of option selections for various interface option objects, with the preconfigured state to determine which interface of the various interfaces has the minimal difference from the preconfigured state. The system may continue processing in 412 of the process 400. Note that one or more of the operations performed in 502-16 may be performed in various orders and combinations, including in parallel.

Figure 6:
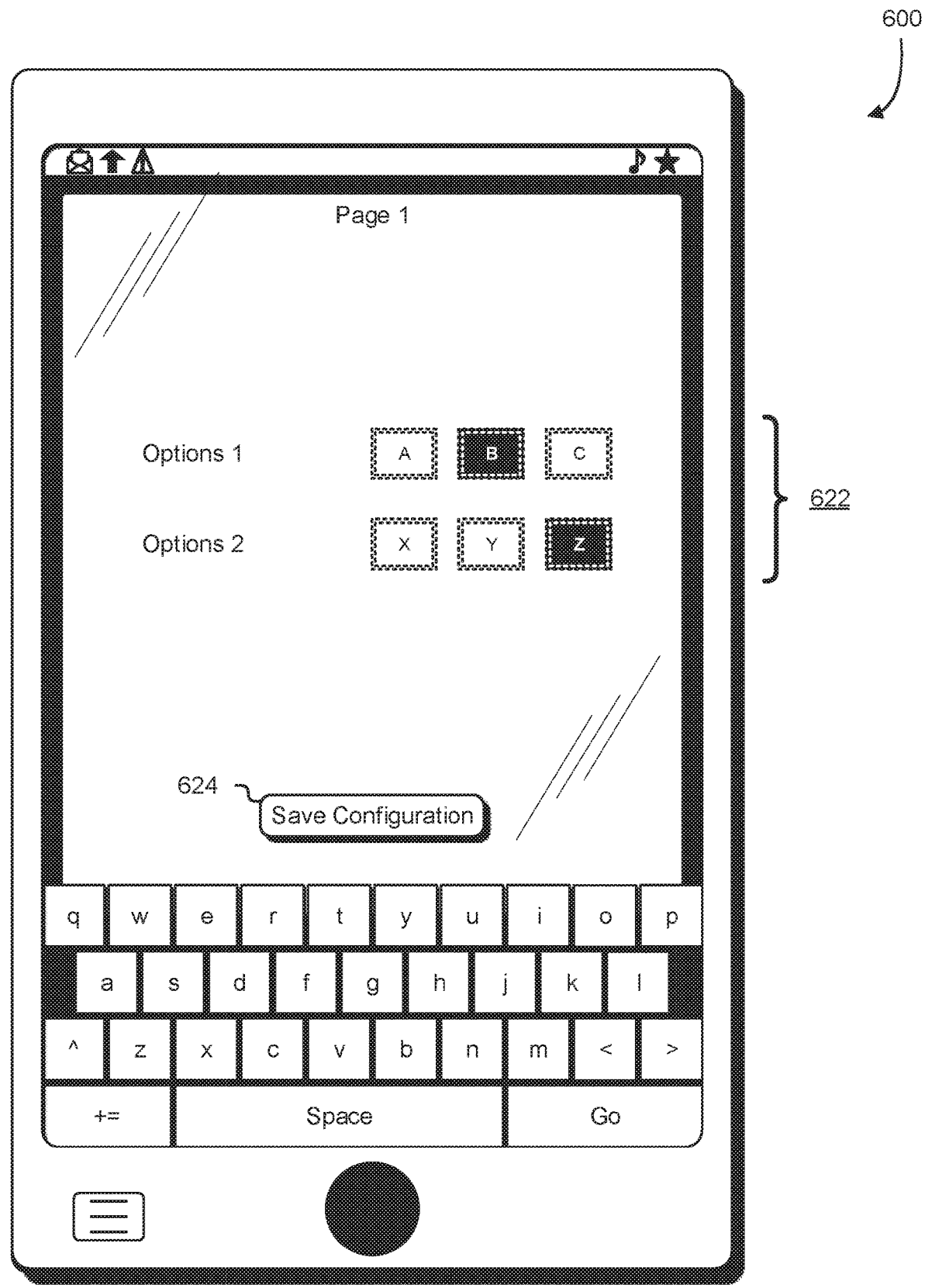
FIG. 6 illustrates an example of an application for storing configured options of an entity in accordance with an embodiment.

FIG. 6 illustrates an example 600 of an application for storing configured options of an entity, in accordance with an embodiment. The example 600 may include a set of options 622, which may be saved through an interface element 624. In various embodiments, the application may be associated with a system, such as the interface analysis system 102 as described in connection with FIG. 1. In various examples, the application may be a software application, and may be run on one or more devices, such as a mobile device, computer, computing device, and/or variations thereof.

In various embodiments, the set of options 622 may be a set of interface elements of an interface, which may be provided by an interface provider. The application may extract the set of options 622 from the interface provider through one or more processes. In some examples, the application may directly retrieve the set of options 622 from one or more interfaces provided by the interface provider, such as by reproducing the one or more interfaces from the interface provider (e.g., the interfaces may be webpages, in which the application may directly load the interfaces). In various examples, the set of options 622 may be a simplified view of one or more interfaces from the interface provider. The set of options 622 may correspond to a configuration that may be utilized in connection with the interface provider. For example, the set of options 622 may specify various options of a service that may be provided by the interface provider.

An entity may desire a specific configuration of the set of options 622. The entity may, through interaction with the set of options 622, select the desired specific configuration. Referring to FIG. 6, the entity may select interface element "B" for the interface element "Option 1" and interface element "Z" for the interface element "Option 2" (depicted as the shaded boxes in FIG. 6). The entity may select the options by interacting with the device the application may be running on. For example, the device may be a mobile device, in which the entity may, through the appropriate interfaces, interact with the mobile device to select the desired specific configuration of the set of options 622.

The entity may desire to save the specified configuration of the set of options 622 through the interface element 624. In various examples, the selection of the interface element 624 may cause the application to execute code, which may be denoted as integration code, option retrieval code, and/or variations thereof, that may save the specified configuration of the set of options 622. The code may determine which of the interface elements, which may represent options, of the set of options 622 are selected, and save the specified configuration of selected interface elements in one or more formats. The specified configuration may, upon the selection of the interface element 624, also be utilized to generate integration code, which may be utilized restore the specified configuration at a later time. In various embodiments, the interface element 624 may cause the application to generate integration code that, when executed, may restore the specified configuration of the set of options 622 for the entity within one or more interfaces of the interface provider.

As an illustrative example, the application may provide a simplified view or view of an interface of a reservation service. Continuing with this example, the set of options 622, which may be part of the interface, may correspond to options for a specific place and a specific time for a reservation, represented by interface elements "Options 1" and "Options 2," respectively. Continuing with this example, the entity may desire to reserve a specific place corresponding to the interface element "B" at a specific time corresponding to the interface element "Z." Continuing with this example, the entity may select the interface elements "B" and "Z" corresponding to the entity's desired place and time, and select the interface element 624 to save the configuration. Continuing with the example, the application may generate integration code such that the selected options, indicated by the selected interface elements "B" and "Z," may be re-selected/restored at a later time. Continuing with this example, the integration code may be provided to the entity through the application. Continuing with this example, the entity may execute the integration code through the application at a later time, which may cause the application to interact with the interface of the reservation service to restore the previously selected options within the interface, and provide the interface or the simplified view of the interface to the entity.

Figure 7:
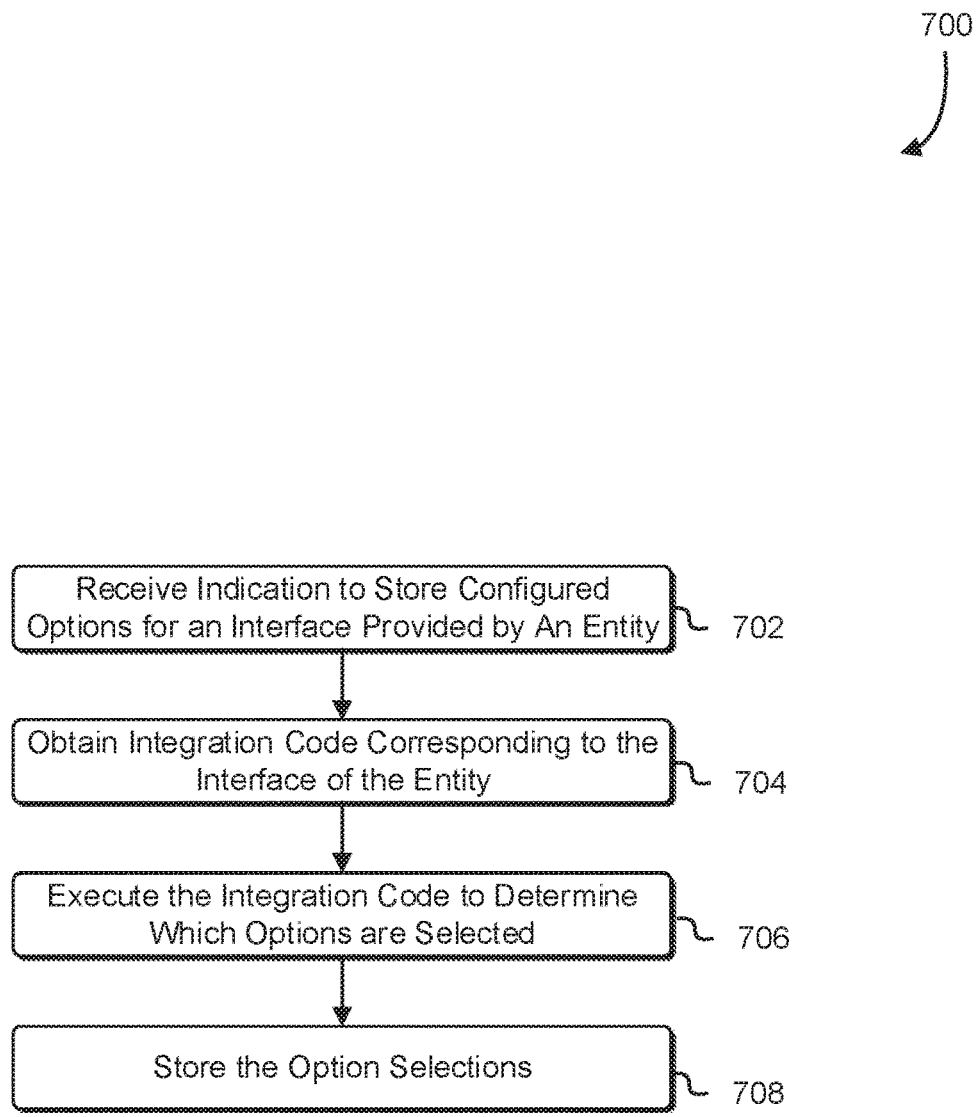
FIG. 7 is a flowchart that illustrates an example of a client utilizing interface to store selected options in accordance with an embodiment.

FIG. 7 is a flowchart that illustrates an example of a process 700 of a client utilizing an interface to store selected options, in accordance with an embodiment. Some or all of the process 700 (or any other processes described, or variations and/or combinations of those processes) may be performed under the control of one or more computer systems configured with executable instructions and/or other data, and may be implemented as executable instructions executing collectively on one or more processors. The executable instructions and/or other data may be stored on a non-transitory computer-readable storage medium (e.g., a computer software program persistently stored on magnetic, optical, or other persistent storage media). For example, some or all of process 700 may be performed by any suitable system, such as the computing device 1000 of FIG. 10 or the interface analysis system 102 as described in connection with FIG. 1. The process 700 includes a series of operations wherein a client may utilize an interface in connection with a system to store selected options.

In 702, the system performing the process 700 may receive an indication to store configured options for an interface provided by an entity. The entity may provide the interface to the system through a software application, such as the application as described in connection with FIG. 6, or various other interfaces. The interface may be an interface of an interface provider, which may provide various services. The interface may be associated with one or more interfaces of the interface provider, and may allow for various users to select various interface elements within the interface that may correspond to various options of the various services the interface provider may provide. In some examples, the interface may be a webpage, in which the entity may provide a URI of the webpage to the system. The entity may configure the various options through interaction with one or more interface elements of the interface, and indicate to the system to store the configured options. As an illustrative example, the entity may be a client of a service, and the interface may be an interface of the service, and may comprise interface elements that allow the client to select a specific configuration of options relating to the service being provided to the client. Continuing with this example, the client may provide the interface to the system through one or more software applications. Continuing with the example, the client may select a specific configuration of options through interaction with one or more interface elements of the interface provided to the system, and indicate to the system to store the specific configuration of options.

In 704, the system may obtain integration code corresponding to the interface of the entity. In some examples, the system may generate the integration code in response to the entity providing the interface. In other examples, the system may have already generated integration code corresponding to the interface of the entity, and may retrieve the integration code from one or more databases. In various embodiments, the integration code may be code that, when executed, may analyze the interface and determine various characteristics of the interface, such as classifications of various interface elements, the state of various interface elements, and/or variations thereof. Continuing with the above example, the system may analyze the provided interface, and may retrieve the appropriate integration code corresponding to the interface and the service.

In 706, the system may execute the integration code to determine which options are selected. The system may execute the integration code in connection with the interface. In some examples, the system may inject the integration code into the source code of the interface to determine which options are selected. In various embodiments, the options may be selected through one or more interface elements of the interface, in which the integration code may analyze the one or more interface elements as well as source code relating to the one or more interface elements to determine the selected options. Continuing with the above example, the system may utilize the retrieved integration code to analyze the interface and the service. Continuing with this example, the system may, through the integration code, determine the specific configuration of options selected by the client through the one or more interface elements of the interface.

In 708, the system may store the options selections. The system may determine the options selections through the use of the integration code. The system may store the option selections in one or more databases, and may retrieve them for later use. The system may store the option selections in various formats, such as a JSON, text file, or otherwise any data format that may store information. Continuing with the above example, the system may save a representation of the determined specific configuration of options through one or more file formats, and store the representation in one or more databases that may be accessible to the system. Note that one or more of the operations performed in 702-08 may be performed in various orders and combinations, including in parallel.

Figure 8:
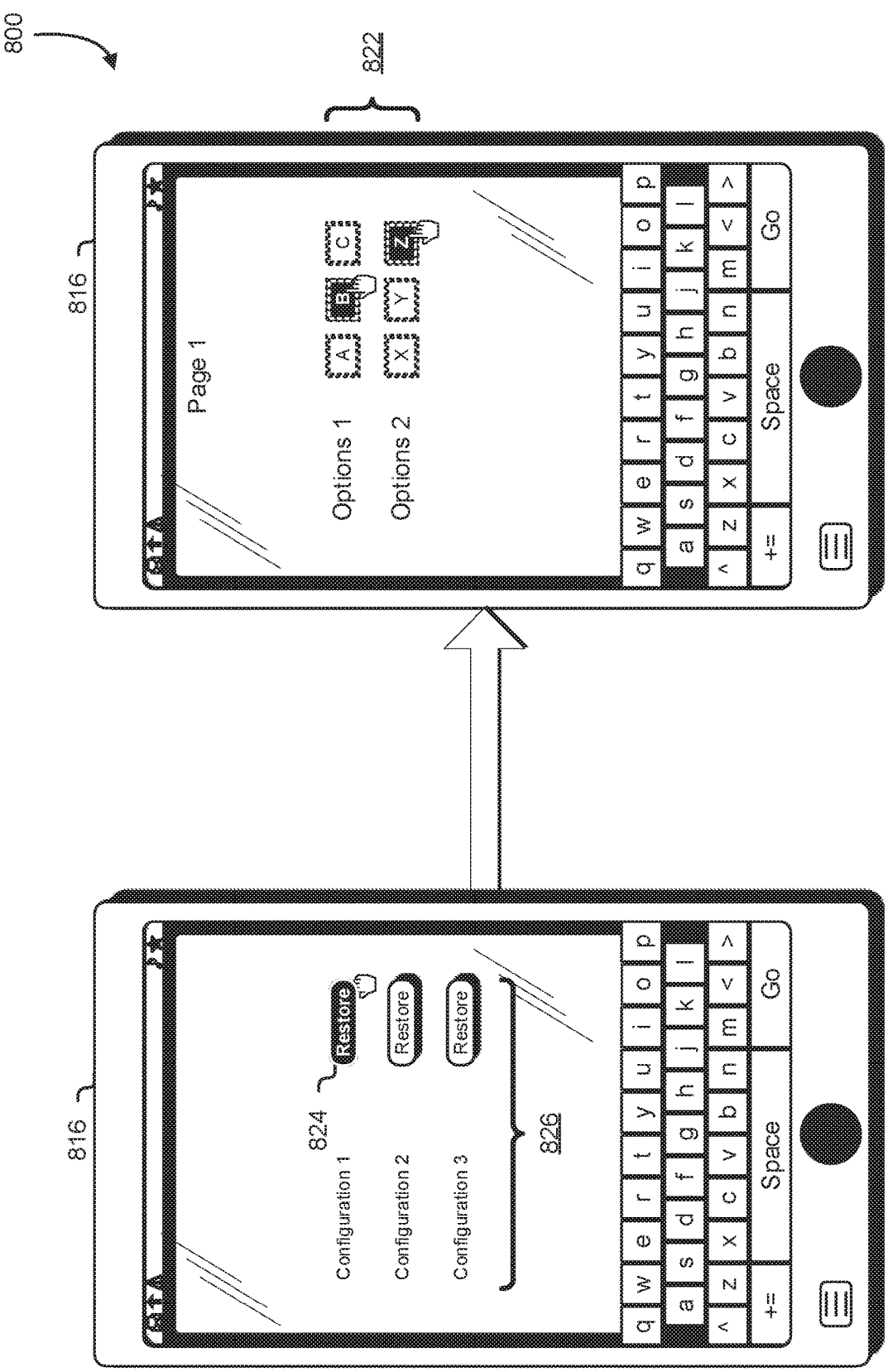
FIG. 8 illustrates an example of an application for restoring previously configured options in accordance with an embodiment.

FIG. 8 illustrates an example 800 of an application for restoring previously configured options, in accordance with an embodiment. The example 800 may include a set of options 822, a set of interface elements 826, and an interface element 824. In various embodiments, the application may be a software application implemented by and/or associated with a system such as the interface analysis system 102 as described in connection with FIG. 1. In various examples, the application may be a software application like the application described in connection with FIG. 6. The software application may be executed by a client device, such as the client device 816. The client device 816 may be similar to the client device 116 of FIG. 1.

In various embodiments, an entity may have selected a specific configuration of options (e.g., through the selection of various interface elements) for an interface of an interface provider. The entity may utilize the application to select the specific configuration of options (e.g., the application may provide a view of the interface, in which the entity may interact with the interface through the application to select the specific configuration of options), and perform one or more processes in connection with the application to cause the application to store the specific configuration of options. The stored specific configuration of options may be depicted as the interface element "Configuration 1," along with other potentially stored specific configurations of options (e.g., "Configuration 2" and "Configuration 3") for various other interfaces and interface providers. The set of interface elements 826 may be interface elements that correspond to configurations of options for various interfaces of various interface providers that may be input by the entity through the application and stored by the application. Further information regarding storing configured options on behalf of the entity can be found in the description of FIG. 6.

The entity may desire to restore the specific configuration of options for the interface of the interface provider. The entity may utilize the selectable interface element 824 to restore the specific configuration of options as indicated by "Configuration 1." Upon the entity selecting the interface element 824, the application may retrieve integration code corresponding to the specific configuration of options. The application may utilize the integration code to restore the specific configuration of options within the interface of the interface provider. In some examples, the integration code may interact with the interface of the interface provider and select various appropriate interface elements to restore the specific configuration of options within the interface. The application may then provide the resulting interface, which may comprise the set of options 822 corresponding to the specific configuration of options restored, to the entity.

As an illustrative example, the application may, as indicated through the set of interface elements 826, have stored various configurations of options of various interfaces from various interface providers on behalf of the entity. Continuing with this example, the interface element depicted as "Configuration 1" may correspond to a specific configuration of options for an interface of a reservation service. Continuing with this example, the entity may desire to restore the specific configuration of options within the interface of the reservation service by interacting with the interface element 824. Continuing with this example, the application may then, following the interaction of the entity with the interface element 824, retrieve the appropriate integration code, restore the specific configuration of options within the interface of the reservation service, and provide the resulting interface to the entity.

In some embodiments, the application may be configured to monitor the interface of the provider even when not actively in use by a user of the client device 816 (e.g., running in the background)—or receive notifications from a server of an entity that provided the application—and notify the user via the device (e.g., an alert, message, or other notification) if the interface of the provider has changed (e.g., any values of any element of the interface has decreased and/or increased.

Figure 9:
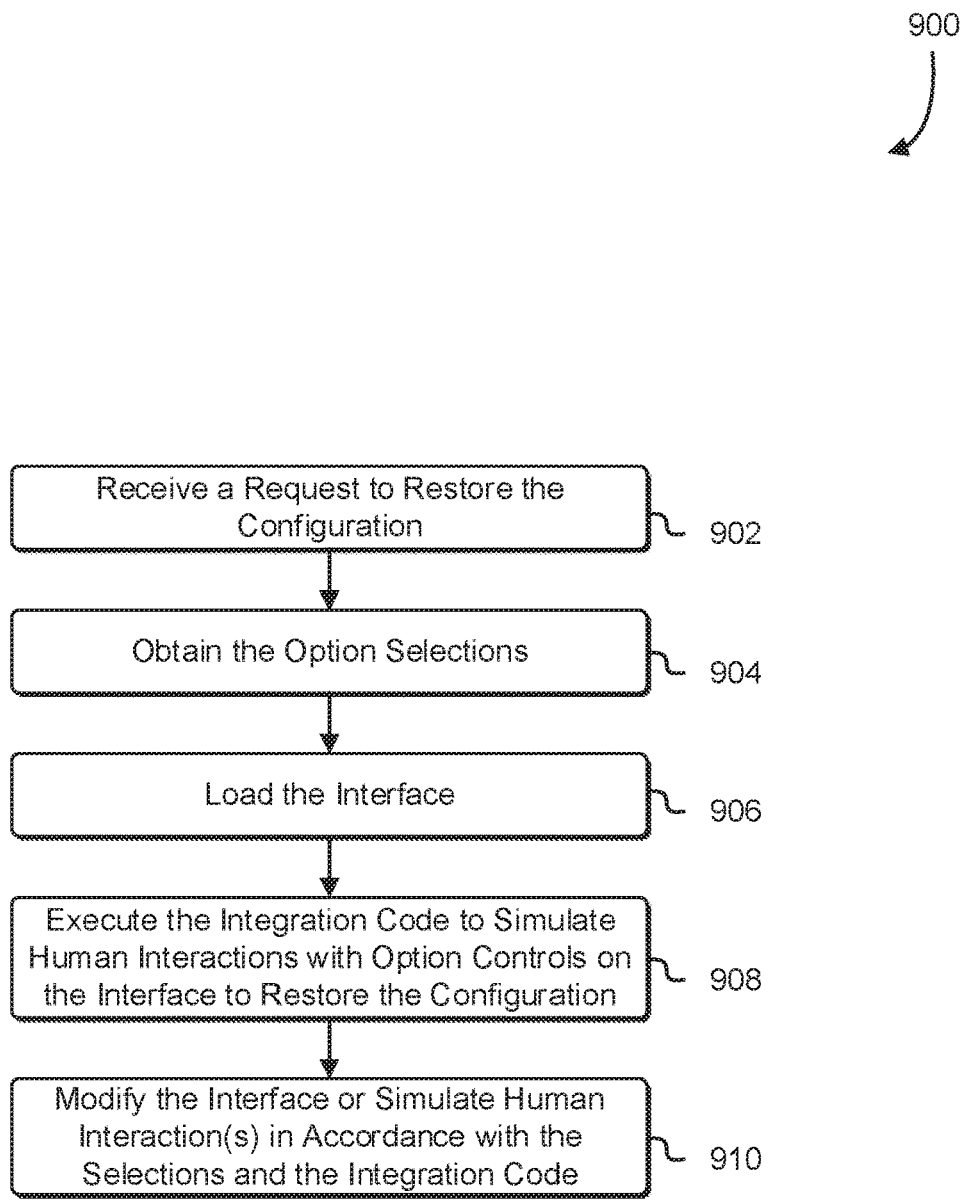
FIG. 9 is a flowchart that illustrates an example of restoring configured options in accordance with an embodiment.

FIG. 9 is a flowchart that illustrates an example of a process 900 for restoring configured options, in accordance with an embodiment. Some or all of the process 900 (or any other processes described, or variations and/or combinations of those processes) may be performed under the control of one or more computer systems configured with executable instructions and/or other data, and may be implemented as executable instructions executing collectively on one or more processors. The executable instructions and/or other data may be stored on a non-transitory computer-readable storage medium (e.g., a computer software program persistently stored on magnetic, optical, or other persistent storage media). For example, some or all of process 900 may be performed by any suitable system, such as the computing device 1000 of FIG. 10 or the interface analysis system 102 as described in connection with FIG. 1. The process 900 includes a series of operations wherein a system may restore configured options.

In 902, the system may receive a request to restore the configuration. The configuration may be a specific configuration of selected interface elements, which may correspond to various options, for an interface provided by an entity. In various examples, the entity may have input the specific configuration and the interface to the system, and may have caused the system to store the configuration within the system as part of one or more processes such as the process 700 of FIG. 7. The entity may utilize one or more applications which may be provided by the system to cause the system to store the configuration.

In 904, the system may obtain the option selections. The option selections may correspond to the specific configuration of selected interface elements, and may be retrieved from various databases the system may comprise. In various examples, the option selections may be retrieved from one or more remote servers. The option selections may be stored in various formats, such as a JSON file, text file, or otherwise any data format that may store information that may indicate the option selections. In 906, the system may load the interface. The system may load the interface by communicating with an interface provider that may provide the interface. For example, the interface may be a webpage, in which the system may load the interface by utilizing a web browser and a URI of the webpage. In various embodiments, the system may load the interface utilizing one or more applications, such as the application as described in connection with FIG. 8.

In 908, the system may execute the integration code to simulate human interactions with option controls on the interface to restore the configuration. The system may have retrieved the integration code as part of obtaining the options selections. In various embodiments, the integration code may be executable code that interacts with various interface elements of the interface to restore the specific configuration of selected interface elements within the interface. The integration code may also interact with the source code of the interface. In various embodiments, the integration code may utilize simulated human interaction to interact with the interface. The integration code may cause the system to select the appropriate interface elements within the interface such that the specific configuration of selected interface elements is restored within the interface.

In 910, the system may modify the interface or simulate human interactions in accordance with the selections and the integration code. The system may perform further actions such that the interface comprising the restored specific configuration of selected interface elements is provided to the client. The system may perform additional actions through one or more interfaces of the interface provider that may process the restored specific configuration on behalf of the client. Note that one or more of the operations performed in 902-10 may be performed in various orders and combinations, including in parallel.

Note that, in the context of describing disclosed embodiments, unless otherwise specified, use of expressions regarding executable instructions (also referred to as code, applications, agents, etc.) performing operations that "instructions" do not ordinarily perform unaided (e.g., transmission of data, calculations, etc.) denote that the instructions are being executed by a machine, thereby causing the machine to perform the specified operations.

Figure 10:
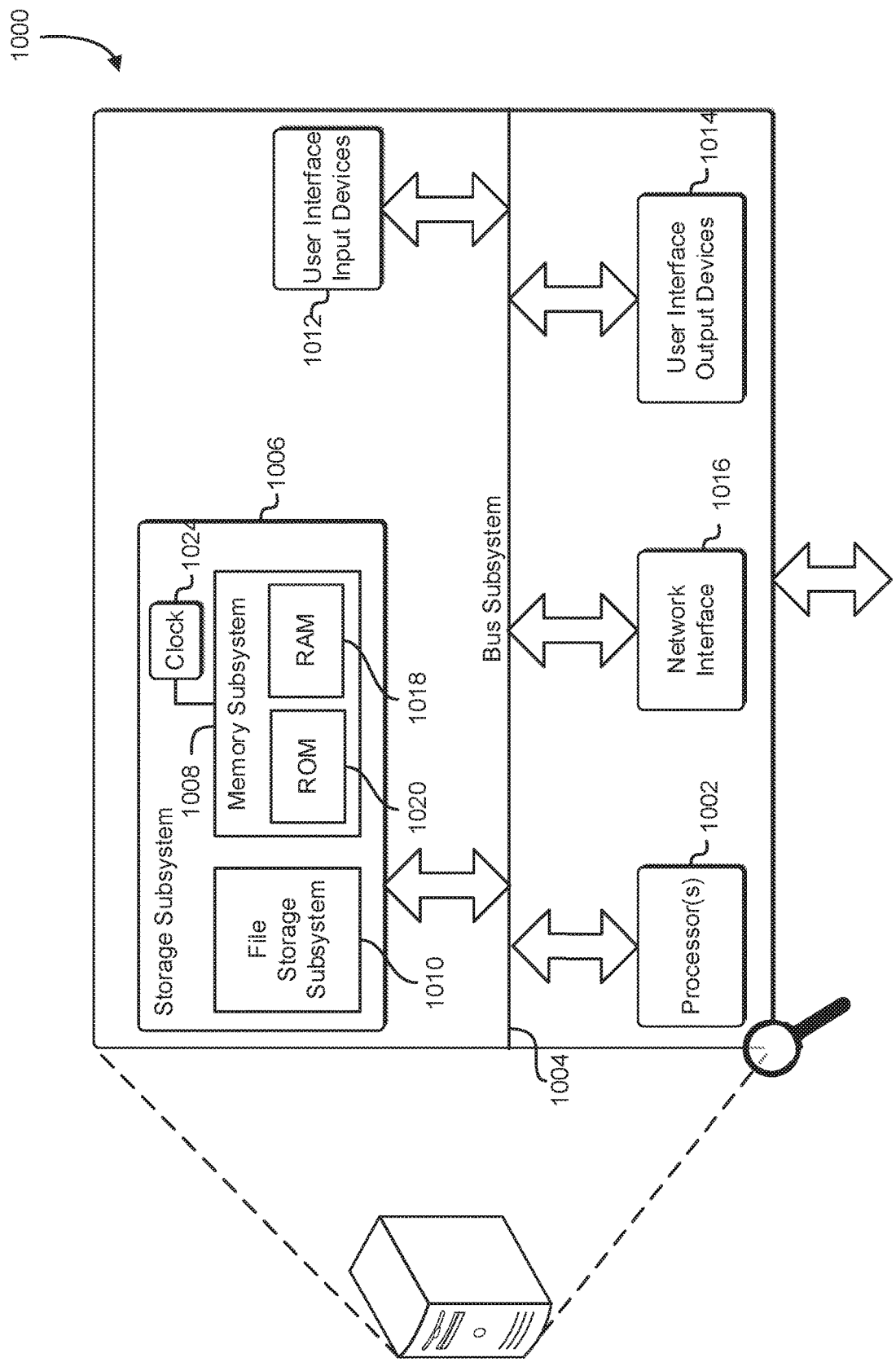
FIG. 10 illustrates a computing device that may be used in accordance with at least one embodiment/an environment in which various embodiments can be implemented.

FIG. 10 is an illustrative, simplified block diagram of a computing device 1000 that can be used to practice at least one embodiment of the present disclosure. In various embodiments, the computing device 1000 includes any appropriate device operable to send and/or receive requests, messages, or information over an appropriate network and convey information back to a user of the device. The computing device 1000 may be used to implement any of the systems illustrated and described above. For example, the computing device 1000 may be configured for use as a data server, a web server, a portable computing device, a personal computer, a cellular or other mobile phone, a handheld messaging device, a laptop computer, a tablet computer, a set-top boxes, a personal data assistant, an embedded computer system, an electronic book readers, or any electronic computing device. The computing device 1000 may be implemented as a hardware device, a virtual computer system, or one or more programming modules executed on a computer system, and/or as another device configured with hardware and/or software to receive and respond to communications (e.g., web service application programming interface (API) requests) over a network.

As shown in FIG. 10, the computing device 1000 may include one or more processors 1002 that, in embodiments, communicate with and are operatively coupled to a number of peripheral subsystems via a bus subsystem. In some embodiments, these peripheral subsystems include a storage subsystem 1006, comprising a memory subsystem 1008 and a file/disk storage subsystem 1010, one or more user interface input devices 1012, one or more user interface output devices 1014, and a network interface subsystem 1016. Such storage subsystem 1006 may be used for temporary or long-term storage of information.

In some embodiments, the bus subsystem 1004 may provide a mechanism for enabling the various components and subsystems of computing device 1000 to communicate with each other as intended. Although the bus subsystem 1004 is shown schematically as a single bus, alternative embodiments of the bus subsystem utilize multiple buses. The network interface subsystem 1016 may provide an interface to other computing devices and networks. The network interface subsystem 1016 may serve as an interface for receiving data from and transmitting data to other systems from the computing device 1000. In some embodiments, the bus subsystem 1004 is utilized for communicating data such as details, search terms, and so on. In an embodiment, the network interface subsystem 1016 may communicate via any appropriate network that would be familiar to those skilled in the art for supporting communications using any of a variety of commercially available protocols, such as Transmission Control Protocol/Internet Protocol (TCP/IP), User Datagram Protocol (UDP), protocols operating in various layers of the Open System Interconnection (OSI) model, File Transfer Protocol (FTP), Universal Plug and Play (UpnP), Network File System (NFS), Common Internet File System (CIFS), and other protocols.

The network, in an embodiment, is a local area network, a wide-area network, a virtual private network, the Internet, an intranet, an extranet, a public switched telephone network, a cellular network, an infrared network, a wireless network, a satellite network, or any other such network and/or combination thereof, and components used for such a system may depend at least in part upon the type of network and/or system selected. In an embodiment, a connection-oriented protocol is used to communicate between network endpoints such that the connection oriented protocol (sometimes called a connection-based protocol) is capable of transmitting data in an ordered stream. In an embodiment, a connection-oriented protocol can be reliable or unreliable. For example, the TCP protocol is a reliable connection-oriented protocol. Asynchronous Transfer Mode (ATM) and Frame Relay are unreliable connection-oriented protocols. Connection-oriented protocols are in contrast to packet-oriented protocols such as UDP that transmit packets without a guaranteed ordering. Many protocols and components for communicating via such a network are well known and will not be discussed in detail. In an embodiment, communication via the network interface subsystem 1016 is enabled by wired and/or wireless connections and combinations thereof.

In some embodiments, the user interface input devices 1012 includes one or more user input devices such as a keyboard; pointing devices such as an integrated mouse, trackball, touchpad, or graphics tablet; a scanner; a barcode scanner; a touch screen incorporated into the display; audio input devices such as voice recognition systems, microphones; and other types of input devices. In general, use of the term "input device" is intended to include all possible types of devices and mechanisms for inputting information to the computing device 1000. In some embodiments, the one or more user interface output devices 1014 include a display subsystem, a printer, or non-visual displays such as audio output devices, etc. In some embodiments, the display subsystem includes a cathode ray tube (CRT), a flat-panel device such as a liquid crystal display (LCD), light emitting diode (LED) display, or a projection or other display device. In general, use of the term "output device" is intended to include all possible types of devices and mechanisms for outputting information from the computing device 1000. The one or more user interface output devices 1014 can be used, for example, to present user interfaces to facilitate user interaction with applications performing processes described and variations therein, when such interaction may be appropriate.

In some embodiments, the storage subsystem 1006 provides a computer-readable storage medium for storing the basic programming and data constructs that provide the functionality of at least one embodiment of the present disclosure. The applications (programs, code modules, instructions), when executed by one or more processors in some embodiments, provide the functionality of one or more embodiments of the present disclosure and, in embodiments, are stored in the storage subsystem 1006. These application modules or instructions can be executed by the one or more processors 1002. In various embodiments, the storage subsystem 1006 additionally provides a repository for storing data used in accordance with the present disclosure. In some embodiments, the storage subsystem 1006 comprises a memory subsystem 1008 and a file/disk storage subsystem 1010.

In embodiments, the memory subsystem 1008 includes a number of memories, such as a main random access memory (RAM) 1018 for storage of instructions and data during program execution and/or a read only memory (ROM) 1020, in which fixed instructions can be stored. In some embodiments, the file/disk storage subsystem 1010 provides a non-transitory persistent (non-volatile) storage for program and data files and can include a hard disk drive, a floppy disk drive along with associated removable media, a Compact Disk Read Only Memory (CD-ROM) drive, an optical drive, removable media cartridges, or other like storage media.

In some embodiments, the computing device 1000 includes at least one local clock 1024. The at least one local clock 1024, in some embodiments, is a counter that represents the number of ticks that have transpired from a particular starting date and, in some embodiments, is located integrally within the computing device 1000. In various embodiments, the at least one local clock 1024 is used to synchronize data transfers in the processors for the computing device 1000 and the subsystems included therein at specific clock pulses and can be used to coordinate synchronous operations between the computing device 1000 and other systems in a data center. In another embodiment, the local clock is a programmable interval timer.

The computing device 1000 could be of any of a variety of types, including a portable computer device, tablet computer, a workstation, or any other device described below. Additionally, the computing device 1000 can include another device that, in some embodiments, can be connected to the computing device 1000 through one or more ports (e.g., USB, a headphone jack, Lightning connector, etc.). In embodiments, such a device includes a port that accepts a fiber-optic connector. Accordingly, in some embodiments, this device is that converts optical signals to electrical signals that are transmitted through the port connecting the device to the computing device 1000 for processing. Due to the ever-changing nature of computers and networks, the description of the computing device 1000 depicted in FIG. 10 is intended only as a specific example for purposes of illustrating the preferred embodiment of the device. Many other configurations having more or fewer components than the system depicted in FIG. 10 are possible.

The specification and drawings are, accordingly, to be regarded in an illustrative rather than a restrictive sense. However, it will be evident that various modifications and changes may be made thereunto without departing from the scope of the invention as set forth in the claims. Likewise, other variations are within the scope of the present disclosure. Thus, while the disclosed techniques are susceptible to various modifications and alternative constructions, certain illustrated embodiments thereof are shown in the drawings and have been described above in detail. It should be understood, however, that there is no intention to limit the invention to the specific form or forms disclosed but, on the contrary, the intention is to cover all modifications, alternative constructions and equivalents falling within the scope of the invention, as defined in the appended claims.

In some embodiments, data may be stored in a data store (not depicted). In some examples, a "data store" refers to any device or combination of devices capable of storing, accessing, and retrieving data, which may include any combination and number of data servers, databases, data storage devices, and data storage media, in any standard, distributed, virtual, or clustered system. A data store, in an embodiment, communicates with block-level and/or object level interfaces. The computing device 1000 may include any appropriate hardware, software and firmware for integrating with a data store as needed to execute aspects of one or more applications for the computing device 1000 to handle some or all of the data access and business logic for the one or more applications. The data store, in an embodiment, includes several separate data tables, databases, data documents, dynamic data storage schemes, and/or other data storage mechanisms and media for storing data relating to a particular aspect of the present disclosure. In an embodiment, the computing device 1000 includes a variety of data stores and other memory and storage media as discussed above. These can reside in a variety of locations, such as on a storage medium local to (and/or resident in) one or more of the computers or remote from any or all of the computers across a network. In an embodiment, the information resides in a storage-area network (SAN) familiar to those skilled in the art, and, likewise, any necessary files for performing the functions attributed to the computers, servers or other network devices are stored locally and/or remotely, as appropriate.

In an embodiment, the computing device 1000 may provide access to content including, but not limited to, text, graphics, audio, video, and/or other content that is provided to a user in the form of Hypertext Markup Language, Extensible Markup Language (XML), JavaScript, CSS, JSON, and/or another appropriate language. The computing device 1000 may provide the content in one or more forms including, but not limited to, forms that are perceptible to the user audibly, visually, and/or through other senses. The handling of requests and responses, as well as the delivery of content, in an embodiment, is handled by the computing device 1000 using PHP: Hypertext Preprocessor (PHP), Python, Ruby, Perl, Java, HTML, XML, JSON, and/or another appropriate language in this example. In an embodiment, operations described as being performed by a single device are performed collectively by multiple devices that form a distributed and/or virtual system.

In an embodiment, the computing device 1000 typically will include an operating system that provides executable program instructions for the general administration and operation of the computing device 1000 and includes a computer-readable storage medium (e.g., a hard disk, random access memory (RAM), read only memory (ROM), etc.) storing instructions that if executed (e.g., as a result of being executed) by a processor of the computing device 1000 cause or otherwise allow the computing device 1000 to perform its intended functions (e.g., the functions are performed as a result of one or more processors of the computing device 1000 executing instructions stored on a computer-readable storage medium).

In an embodiment, the computing device 1000 operates as a web server that runs one or more of a variety of server or mid-tier applications, including Hypertext Transfer Protocol (HTTP) servers, FTP servers, Common Gateway Interface (CGI) servers, data servers, Java servers, Apache servers, and business application servers. In an embodiment, computing device 1000 is also capable of executing programs or scripts in response to requests from user devices, such as by executing one or more web applications that are implemented as one or more scripts or programs written in any programming language, such as Java®, C, C# or C++, or any scripting language, such as Ruby, PHP, Perl, Python, or TCL, as well as combinations thereof. In an embodiment, the computing device 1000 is capable of storing, retrieving, and accessing structured or unstructured data. In an embodiment, computing device 1000 additionally or alternatively implements a database, such as one of those commercially available from Oracle®, Microsoft®, Sybase®, and IBM® as well as open-source servers such as MySQL, Postgres, SQLite, MongoDB. In an embodiment, the database includes table-based servers, document-based servers, unstructured servers, relational servers, non-relational servers, or combinations of these and/or other database servers.

The use of the terms "a" and "an" and "the" and similar referents in the context of describing the disclosed embodiments (especially in the context of the following claims) is to be construed to cover both the singular and the plural, unless otherwise indicated or clearly contradicted by context. The terms "comprising," "having," "including" and "containing" are to be construed as open-ended terms (i.e., meaning "including, but not limited to,") unless otherwise noted. The term "connected," when unmodified and referring to physical connections, is to be construed as partly or wholly contained within, attached to or joined together, even if there is something intervening. Recitation of ranges of values in the present disclosure are merely intended to serve as a shorthand method of referring individually to each separate value falling within the range unless otherwise indicated and each separate value is incorporated into the specification as if it were individually recited. The use of the term "set" (e.g., "a set of items") or "subset" unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but the subset and the corresponding set may be equal. The use of the phrase "based on," unless otherwise explicitly stated or clear from context, means "based at least in part on" and is not limited to "based solely on."

Conjunctive language, such as phrases of the form "at least one of A, B, and C," or "at least one of A, B and C," unless specifically stated otherwise or otherwise clearly contradicted by context, is otherwise understood with the context as used in general to present that an item, term, etc., could be either A or B or C, or any nonempty subset of the set of A and B and C. For instance, in the illustrative example of a set having three members, the conjunctive phrases "at least one of A, B, and C" and "at least one of A, B, and C" refer to any of the following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present.

Operations of processes described can be performed in any suitable order unless otherwise indicated or otherwise clearly contradicted by context. Processes described (or variations and/or combinations thereof) can be performed under the control of one or more computer systems configured with executable instructions and can be implemented as code (e.g., executable instructions, one or more computer programs or one or more applications) executing collectively on one or more processors, by hardware or combinations thereof. In some embodiments, the code can be stored on a computer-readable storage medium, for example, in the form of a computer program comprising a plurality of instructions executable by one or more processors. In some embodiments, the computer-readable storage medium is non-transitory.

The use of any and all examples, or exemplary language (e.g., "such as") provided, is intended merely to better illuminate embodiments of the invention and does not pose a limitation on the scope of the invention unless otherwise claimed. No language in the specification should be construed as indicating any non-claimed element as essential to the practice of the invention.

Embodiments of this disclosure are described, including the best mode known to the inventors for carrying out the invention. Variations of those embodiments will become apparent to those of ordinary skill in the art upon reading the foregoing description. The inventors expect skilled artisans to employ such variations as appropriate and the inventors intend for embodiments of the present disclosure to be practiced otherwise than as specifically described. Accordingly, the scope of the present disclosure includes all modifications and equivalents of the subject matter recited in the claims appended hereto as permitted by applicable law. Moreover, any combination of the above-described elements in all possible variations thereof is encompassed by the scope of the present disclosure unless otherwise indicated or otherwise clearly contradicted by context.

All references, including publications, patent applications, and patents, cited are hereby incorporated by reference to the same extent as if each reference were individually and specifically indicated to be incorporated by reference and were set forth in its entirety.

What is claimed is:

1. A computer-implemented method, comprising:
    obtaining a preconfigured state of a first interface having a preconfigured set of options, the first interface provided by an entity;
    launching the first interface in an un-preconfigured state, the first interface including a first set of options corresponding to the preconfigured set of options, the first set of options including a first option and a second option, wherein the first and second options are different;
    analyzing the first interface to determine functionality of an object representing the first set of options;
    producing a first configured interface by performing simulated human interaction with the first set of options to cause the first option of the first set of options to be selected, wherein the simulated human interaction is implemented based on the functionality to select the first option;
    determining a first set of differences between a current state of the first configured interface and the preconfigured state;
    producing a second configured interface by performing the simulated human interaction with the first set of options to cause the second option of the first set of options to be selected, wherein the simulated human interaction is implemented based on the functionality to select the second option;
    determining a second set of differences between a current state of the second configured interface and the preconfigured state;
    determining, based on which of the first set of differences or the second set of differences indicates fewer differences between the preconfigured state and respective configured states, a closest match state to the preconfigured state;
    determining a set of processes associated with the closest match state;
    generating integration code based on the set of processes;
    storing the integration code in association with the entity;
    providing, in response to a first request from a client device for an application, the application to the client device;
    obtaining, as a result of execution of the application, a second request from a client device for the integration code associated with the entity; and
    causing, by providing the integration code to the client device, the client device to modify a second interface on the client device to cause an option of a second set of options in the second interface to be selected, the second interface associated with the entity.

2. The computer-implemented method of claim 1, wherein the first interface is a webpage.

3. The computer-implemented method of claim 1, wherein performing the simulated human interaction includes emulating a click event or a touch event directed to the first set of options.

4. The computer-implemented method of claim 1, wherein the second request indicates a selection from a colslection of stored configurations associated with a plurality of entities that includes the entity.

5. A system, comprising:
one or more processors; and
memory including executable instructions that, if executed by the one or more processors, cause the system to:
determine functionality of a control object of a first interface, the control object being is associated with a first option and a second option different from the first option;
launch a first interface having the control object;
engage, at a first time in a manner dependent on the functionality of the control object, the control object to select the first option;
determine a first set of differences between a first current state of the first interface and a preconfigured state of the first interface;
engage, at a second time in the manner dependent on the functionality of the control object, the control object to select the second option;
determine a second set of differences between a second current state of the first interface and the preconfigured state of the first interface;
generate, based on which of the first set of differences or the second set of differences indicates fewer differences from the preconfigured state, integration code that, upon execution by a client device, causes the client device to modify a second interface different from the first interface; and
provide the integration code to the client device to cause the client device to modify the second interface.

6. The system of claim 5, wherein the first interface and the second interface are provided by a same entity.

7. The system of claim 5, wherein the executable instructions further include instructions that cause the system to:
obtain an indication of a change to information in the second interface; and
provide the client device with a notification of the change to the information.

8. The system of claim 5, wherein the integration code is JavaScript code.

9. The system of claim 5, wherein the executable instructions that cause the system to generate the integration code further include instructions that further cause the system to:
determine that the first set of differences indicates that the first current state deviates least from the preconfigured state; and
generate the integration code based on the first set of differences.

10. The system of claim 9, wherein the executable instructions further include instructions that cause the system to:
determine a third set of differences that deviates least from an additional preconfigured state, the additional preconfigured state corresponding to a third interface having a different control object associated with different options from the first option and the second option;
determine a set of commonalities between the first set of differences and the third set of differences; and
generate the integration code based on the set of commonalities.

11. The system of claim 5, wherein the integration code that causes the client device to modify the second interface includes code that causes the client device to detect at least one control object in the second interface.

12. The system of claim 11, wherein the integration code that causes the client device to modify the second interface includes code that causes the client device to select at least one option of the at least one control object in the second interface.

13. The system of claim 5, wherein the executable instructions that cause the system to provide the integration code to the client device to cause the client device to modify the second interface include instructions that cause the system to provide the integration code to the client device to cause the client device to dynamically interact with the second interface.

14. The system of claim 5, wherein the executable instructions that cause the system to determine the functionality of the control object further include instructions that further cause the system to:
analyze a document object model (DOM) of the first interface to identify a set of interface elements;
provide the set of interface elements to a machine learning classifier; and
determine the functionality of the control object from a result of received from the machine learning classifier.

15. A non-transitory computer-readable storage medium having stored thereon executable instructions that, if executed by one or more processors of a computer system, cause the computer system to at least:
determine functionality of a configurable control object of a first user interface provided by an entity, the configurable control object being associated with a plurality of different options;
modify source code of the first user interface to produce modified source code that includes executable code that, as a result of being executed, causes the computer system to obtain a selection state of the configurable control object;
execute the modified source code to launch the first user interface in an un-configured state;
determine sets of differences by, for each option of the plurality of different options, causing the computer system to:
based on the functionality, engage the configurable control object to cause the option to be selected;
obtain, at least in part as a result of execution of the executable code, a configured state of the first user interface; and
determine a set of differences between the configured state and a preconfigured state;
determine, based on a member of the sets of differences with fewer differences than other members of the sets of differences, a closest match state to the preconfigured state;
determining a set of processes associated with the closest match state;
generate, based on the set of processes, integration code usable by a client device to cause the client device to modify a second user interface provided by the entity;
obtain a request from a client device for the integration code; and
cause, by providing the integration code to the client device, the client device to modify the second user interface.

16. The non-transitory computer-readable storage medium of claim 15, wherein the source code is in Hypertext Markup Language.

17. The non-transitory computer-readable storage medium of claim 15, wherein the executable instructions further include instructions that cause the computer system to:

obtain the source code of the first user interface that includes the configurable control object;

produce the modified source code by insertion, into the source code, of the executable code;

execute the modified source code to launch the first user interface in an un-configured state;

receive input causing selection of one of the plurality of different options of the configurable control object; and obtain, at least in part as a result of execution of the executable code, the preconfigured state of the first user interface based on the modified source code and the selection state.

18. The non-transitory computer-readable storage medium of claim 15, wherein:

the executable instructions further include executable instructions that cause further the computer system to:

obtain a request from the client device for a particular application; and provide the particular application to the client device; and the request from the client device for the integration code is obtained as a result of execution of the particular application by the client device.

19. The non-transitory computer-readable storage medium of claim 15, wherein the integration code that causes the client device to modify the second user interface includes code that further causes the client device to modify a different configurable control object in the second user interface from the configurable control object in the first user interface.

20. The non-transitory computer-readable storage medium of claim 15, wherein the configurable control object is a drop-down list or a radio button group.

21. The non-transitory computer-readable storage medium of claim 15, wherein a difference in the set of differences between the configured state and the preconfigured state includes a change to a class attribute value of the configurable control object.

22. The non-transitory computer-readable storage medium of claim 15, wherein the executable instructions that cause the computer system to engage the configurable control object include instructions that cause the computer system to emulate a click event or a touch event directed to the configurable control object.

* * * * *